(12) United States Patent
Ding et al.

(10) Patent No.: US 8,748,308 B2
(45) Date of Patent: Jun. 10, 2014

(54) THROUGH WAFER VIAS AND METHOD OF MAKING SAME

(71) Applicant: International Business Machines Corporation, Armonk, NY (US)

(72) Inventors: Hanyi Ding, Essex Junction, VT (US); Alvin J. Joseph, Williston, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/665,976

(22) Filed: Nov. 1, 2012

(65) Prior Publication Data

US 2013/0189827 A1 Jul. 25, 2013

Related U.S. Application Data

(62) Division of application No. 12/188,241, filed on Aug. 8, 2008, now Pat. No. 8,384,224.

(51) Int. Cl.
*H01L 21/4763* (2006.01)
(52) U.S. Cl.
USPC .... 438/637; 438/672; 438/675; 257/E23.174; 257/E23.145
(58) Field of Classification Search
USPC ........... 257/E23.174, E23.145; 438/637, 672, 438/675
See application file for complete search history.

(56) References Cited

U.S. PATENT DOCUMENTS

| 4,666,556 | A | 5/1987 | Fulton et al. |
| 4,690,729 | A | 9/1987 | Douglas |
| 5,933,748 | A | 8/1999 | Chou et al. |
| 5,998,292 | A | 12/1999 | Black et al. |
| 6,406,934 | B1 | 6/2002 | Glenn et al. |
| 6,836,020 | B2 | 12/2004 | Cheng et al. |
| 7,005,388 | B1 | 2/2006 | Hopper et al. |
| 7,056,813 | B2 | 6/2006 | Morrow et al. |
| 7,071,098 | B2 | 7/2006 | Kirby et al. |
| 7,224,051 | B2 | 5/2007 | Farnworth et al. |
| 7,259,454 | B2 | 8/2007 | Tanida et al. |
| 7,271,491 | B1 | 9/2007 | Akram |
| 7,276,787 | B2 | 10/2007 | Edelstein et al. |
| 7,482,272 | B2 | 1/2009 | Trezza |

(Continued)

FOREIGN PATENT DOCUMENTS

WO 2007023947 5/2007

OTHER PUBLICATIONS

Notice of Allowance (Mail Date Oct. 30, 2009) for U.S. Appl. No. 12/188,230, filed Aug. 8, 2008.

(Continued)

*Primary Examiner* — Amar Movva
(74) *Attorney, Agent, or Firm* — Schmeiser, Olsen & Watts; Richard M. Kotulak

(57) ABSTRACT

A method of forming and structure for through wafer vias and signal transmission lines formed of through wafer vias. The structure includes, a semiconductor substrate having a top surface and an opposite bottom surface; and an array of through wafer vias comprising at least one electrically conductive through wafer via and at least one electrically non-conductive through wafer via, each through wafer via of the array of through wafer vias extending from the top surface of to the bottom surface of the substrate, the at least one electrically conductive via electrically isolated from the substrate.

19 Claims, 16 Drawing Sheets

(56) References Cited

U.S. PATENT DOCUMENTS

| | | |
|---|---|---|
| 7,488,680 B2 | 2/2009 | Andry et al. |
| 7,659,202 B2 | 2/2010 | Trezza |
| 7,678,696 B2 | 3/2010 | Andry |
| 7,767,493 B2 | 8/2010 | Trezza |
| 7,781,886 B2 | 8/2010 | Trezza |
| 7,786,592 B2 | 8/2010 | Trezza |
| 7,808,111 B2 | 10/2010 | Trezza |
| 7,838,997 B2 | 11/2010 | Trezza |
| 7,847,412 B2 | 12/2010 | Trezza |
| 7,851,348 B2 | 12/2010 | Misra et al. |
| 7,884,483 B2 | 2/2011 | Trezza et al. |
| 7,919,870 B2 | 4/2011 | Trezza |
| 7,932,584 B2 | 4/2011 | Trezza |
| 7,942,182 B2 | 5/2011 | Trezza et al. |
| 7,946,331 B2 | 5/2011 | Trezza et al. |
| 7,969,015 B2 | 6/2011 | Trezza |
| 7,989,958 B2 | 8/2011 | Trezza et al. |
| 8,035,198 B2 | 10/2011 | Ding et al. |
| 8,093,729 B2 | 1/2012 | Trezza |
| 8,138,036 B2 | 3/2012 | Andry et al. |
| 8,154,131 B2 | 4/2012 | Trezza et al. |
| 8,299,566 B2 | 10/2012 | Ding et al. |
| 8,384,224 B2 | 2/2013 | Ding et al. |
| 8,518,787 B2 | 8/2013 | Ding et al. |
| 2005/0236669 A1 | 10/2005 | Chien |
| 2005/0248002 A1 | 11/2005 | Newman et al. |
| 2006/0001174 A1 | 1/2006 | Matsui |
| 2006/0006539 A1 | 1/2006 | Matsui et al. |
| 2006/0105496 A1 | 5/2006 | Chen et al. |
| 2006/0118965 A1 | 6/2006 | Matsui |
| 2006/0154438 A1 | 7/2006 | Kishimoto et al. |
| 2006/0197119 A1 | 9/2006 | Chinthakindi et al. |
| 2006/0214298 A1 | 9/2006 | Huang et al. |
| 2006/0275946 A1 | 12/2006 | MacNamara et al. |
| 2007/0045779 A1 | 3/2007 | Hiatt |
| 2007/0048896 A1 | 3/2007 | Andry et al. |
| 2007/0120241 A1 | 5/2007 | Trezza et al. |
| 2007/0190692 A1 | 8/2007 | Erturk et al. |
| 2007/0196948 A1 | 8/2007 | Trezza |
| 2007/0197018 A1 | 8/2007 | Chen et al. |
| 2008/0079131 A1 | 4/2008 | Kim et al. |
| 2008/0099870 A1 | 5/2008 | Wilson |
| 2009/0215237 A1 | 8/2009 | Disney et al. |
| 2009/0244954 A1 | 10/2009 | Cannon et al. |
| 2009/0267126 A1 | 10/2009 | Wang et al. |
| 2010/0032764 A1 | 2/2010 | Andry et al. |
| 2010/0032808 A1 | 2/2010 | Ding et al. |
| 2010/0032810 A1 | 2/2010 | Ding et al. |
| 2010/0032811 A1 | 2/2010 | Ding et al. |
| 2010/0035430 A1 | 2/2010 | Andry et al. |
| 2010/0090307 A1 | 4/2010 | Moriya et al. |
| 2011/0012196 A1 | 1/2011 | Williams et al. |

OTHER PUBLICATIONS

Office Action (Mail Date Jul. 28, 2011) for U.S. Appl. No. 12/188,228, filed Aug. 8, 2008.
Amendment filed Oct. 18, 2011 in response to Office Action (Mail Date Jul. 28, 2011) for U.S. Appl. No. 12/188,228, filed Aug. 8, 2008.
Notice of Allowance (Mail Date Nov. 23, 2011) for U.S. Appl. No. 12/188,228, filed Aug. 8, 2008.
Office Action (Mail Date Sep. 1, 2010) for U.S. Appl. No. 12/188,229, filed Aug. 8, 2008.
Amendment filed Nov. 23, 201 in response to Office Action (Mail Date Sep. 1, 2010) for U.S. Appl. No. 12/188,229, filed Aug. 8, 2008.
Final Office Action (Mail Date Feb. 1, 2011) for U.S. Appl. No. 12/188,229, filed Aug. 8, 2008.
Amendment After Final filed Mar. 31, 2011 in response to Final Office Action (Mail Date Feb. 1, 2011) for U.S. Appl. No. 12/188,229, filed Aug. 8, 2008.
Advisory Action (Mail Date Apr. 18, 2011) for U.S. Appl. No. 12/188,229, filed Aug. 8, 2008.
Amendment After Final filed May 17, 2011 in response to Advisory Action (Mail Date Apr. 18, 2011) for U.S. Appl. No. 12/188,229, filed Aug. 8, 2008.
Notice of Allowance (Mail Date Jun. 9, 2011) for U.S. Appl. No. 12/188,229, filed Aug. 8, 2008.
Office Action (Mail Date Apr. 28, 2011) for U.S. Appl. No. 12/188,241, filed Aug. 8, 2008.
Amendment filed Aug. 24, 2011 in response to Office Action (Mail Date Apr. 28, 2011) for U.S. Appl. No. 12/188,241, filed Aug. 8, 2008.
Final Office Action (Mail Date Oct. 26, 2011) for U.S. Appl. No. 12/188,241, filed Aug. 8, 2008.
Amendment After Final filed Dec. 21, 2011 in response to Final Office Action (Mail Date Oct. 26, 2011) for U.S. Appl. No. 12/188,241, filed Aug. 8, 2008.
Office Action (Maile Date Feb. 22, 2012) for U.S. Appl. No. 12/188,236, filed Aug. 8, 2008.
Amendment filed May 16, 2012 in response to Office Action (Mail Date Feb. 22, 2012) for U.S. Appl. No. 12/188,236, filed Aug. 8, 2008.
Notice of Allowance (Mail Date Jul. 18, 2012) for U.S. Appl. No. 12/188,236, filed Aug. 8, 2008.
Advisory Action (Mail Date Jan. 23, 2012) for U.S. Appl. No. 12/188,241, filed Aug. 8, 2008.
Notice of Appeal filed Feb. 27, 2012 for U.S. Appl. No. 12/188,241, filed Aug. 8, 2008.
Appeal Brief filed Apr. 6, 2012 for U.S. Appl. No. 12/188,241, filed Aug. 8, 2008.
Notice of Allowance (Mail Date Oct. 11, 2012) for U.S. Appl. No. 12/188,241, filed Aug. 8, 2008.
U.S. Appl. No. 13/604,731, filed Sep. 6, 2012.
Office Action (Mail Date Feb. 22, 2012) for U.S. Appl. No. 12/188,236, filed Aug. 8, 2008.

THROUGH WAFER VIAS AND METHOD OF MAKING SAME

RELATED APPLICATIONS

This application is a division of U.S. patent application Ser. No. 12/188,241 filed on Aug. 8, 2008 now U.S. Pat. No. 8,384,224, issued Feb. 26, 2013.

FIELD OF THE INVENTION

The present invention relates to the field of integrated circuit chips; more specifically, it relates to through wafer vias for use in integrated circuit chips and the method of fabricating the through wafer vias.

BACKGROUND OF THE INVENTION

To increase the density of devices using integrated circuit chips it is desirable to allow interconnections to be made to both the top and bottom surfaces of the integrated circuit chip. This requires formation of through wafer vias from the top to the bottom surface of the integrated chip that are compatible with carrying both high frequency and DC signals. Many existing through via schemes are either difficult to integrate into existing integrated circuit fabrication processes or result in unacceptable degradation of signals propagating from/to the front surface of the integrated circuit chip to/from the bottom surface of the integrated circuit chip. Accordingly, there exists a need in the art to overcome the deficiencies and limitations described hereinabove.

SUMMARY OF THE INVENTION

A first aspect of the present invention is a structure, comprising: a semiconductor substrate having a top surface and an opposite bottom surface; and an array of through wafer vias comprising at least one electrically conductive through wafer via and at least one electrically non-conductive through wafer via, each through wafer via of the array of through wafer vias extending from the top surface of to the bottom surface of the substrate, the at least one electrically conductive via electrically isolated from the substrate.

A second aspect of the present invention is a method, comprising: forming an array of through wafer vias comprising at least one electrically conductive through wafer via and at least one electrically non-conductive through wafer via, through a semiconductor substrate having a top surface and an opposite bottom surface, each through wafer via of the array of through wafer vias extending from the top surface of to the bottom surface of the substrate, the at least one electrically conductive via electrically isolated from the substrate.

A third aspect of the present invention is a method, comprising: (a) forming a first trench and a second trench in a semiconductor substrate, the first and second trenches extending in a first direction from a top surface of the substrate toward an opposite bottom surface of the substrate a distance less than a thickness of the substrate in the first direction; after (a), (b) simultaneously forming a first liner of a dielectric material on sidewalls of the first trench and a second liner of the dielectric material on sidewalls of the second trench; after (b), (c) filling remaining space in the first trench with an electrically conductive material and forming a third liner of the electrically conductive material on the second liner, the third liner not completely filling the second trench; after (c), (d), filling remaining space in the second trench with a polysilicon core, recessing the polysilicon core and the third liner below the top surface of the substrate, and forming, in the second trench, a dielectric plug on the polysilicon core and the third liner; and after (d), (e) thinning the substrate from the bottom surface of the substrate to form a new bottom surface of the substrate, the electrically conductive material of the first trench and the liner and polysilicon core of the second trench exposed in the new bottom surface of substrate.

A fourth aspect of the present invention is a signal transmission line through a semiconductor substrate, the substrate having a top surface and an opposite bottom surface, comprising: a conductive through via extending from the top surface of the substrate to the bottom surface of the substrate, sidewalls of the conductive through via in physical and electrical contact with the substrate, sidewalls of the conductive through via electrically insulated from the substrate; and a non-conductive through via extending from the top surface of the substrate to the bottom surface of the substrate, the non-conductive through via proximate to and separated from the conductive through wafer via by a region of the substrate, the non-conductive through via comprising a conductive core electrically insulated from the substrate by a dielectric liner and having a dielectric plug recessed between the liner in an end proximate to the top surface of the substrate.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIGS. 3A through 3D are plan views of through wafer vias according to embodiments of the present inventions;

DETAILED DESCRIPTION OF THE INVENTION

The term through wafer via defines a structure that extends from a top surface of a substrate, through the substrate, to an opposite bottom surface of the substrate of the packaged integrated circuit or chip. A through wafer via according to the embodiments of the present invention may be electrically conductive or electrically non-conductive. Although in the description infra, both conductive and non-conductive (i.e., insulating) through vias are described and illustrated as extending from the top to the bottom surface of the chip, the present invention may be practiced where the conductive through via extends entirely through the chip, but the non-conductive only extends partially through the chip because one purpose of the non-conductive through vias is for isolation and not passing electrical signals between the top and bottom surfaces of the chip. An electrically conductive through via includes at least one electrically conductive element and may include non-electrically conductive elements. An electrically non-conductive through via includes at least one electrically non-conductive element and may include electrically conductive elements that are surrounded completely by electrically non-conductive elements. The "wafer" of through wafer via derives from the fact that the via is formed before integrated circuits have been singulated from a semiconductor substrate called a wafer. The term " three dimensional device" defines a device comprising two or more individual substrates electrically connected and in physical contact by being stacked one upon another.

Figure 1A:
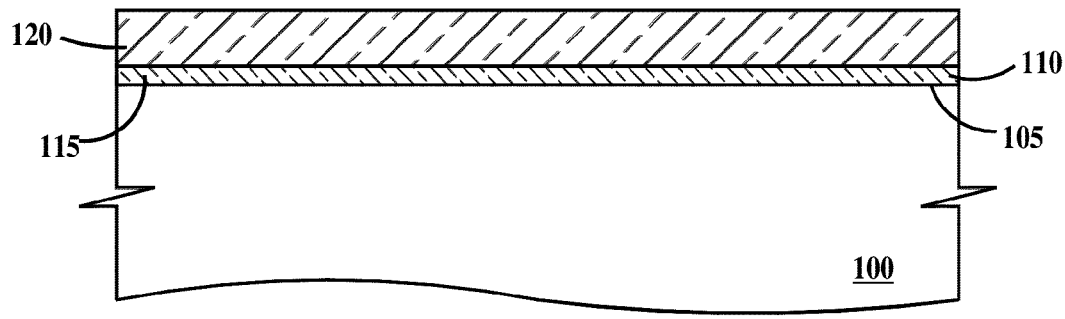
FIGS. 1A through 1K are cross-sectional drawings illustrating initial steps in the fabrication of an array of through wafer vias according embodiments of the present invention.

FIGS. 1A through 1K are cross-sectional drawings illustrating fabrication of a through wafer via is according an embodiment of the present invention. In FIG. 1A, a semiconductor substrate 100 has a top surface 105. Formed on top surface 105 is a first dielectric layer 110. Formed on a top surface 115 of first dielectric layer 110 is a second dielectric layer 120. First and second dielectric layers 110 and 120 are exemplary and there may be a few as one dielectric layer or more than two dielectric layers formed over top surface 105 of substrate 100. In one example, substrate 100 comprise silicon. In one example first dielectric layer 110 is silicon dioxide and second dielectric layer 120 is silicon nitride.

Figure 1B:
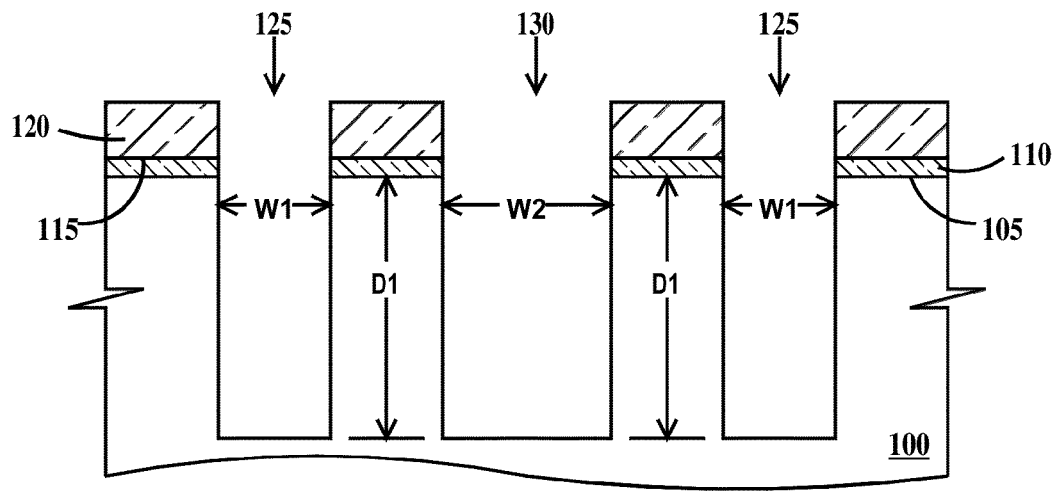

In FIG. 1B, trenches 125 and 130 are etched through first and second dielectric layers 110 and 120 and into substrate 100. Trenches 125 and 130 may be formed using a photolithographic/etching process. An exemplary photolithographic/etching process comprises (1) forming a photoresist layer on second dielectric layer 120, (2) forming openings in the photoresist layer by exposing the photoresist layer to actinic radiation through a patterned photomask and developing away either the exposed or unexposed regions of the photoresist, (4) etching through, the first and second dielectric layers using, for example, a reactive ion etch (RIE) process, (5) removing the patterned photoresist layer, and (6) etching substrate 100 using, for example, an RIE process using the pattern in the first and second dielectric layers as a patterned hardmask. Although trenches 125 and 130 are shown etched to the same depth in FIG. 1B, trenches 125 and 130 may be etched to different depths. For example, an etch process commonly referred to as the "Bosch" silicon etch process will etch trenches having wide (W2) openings deeper then trenches having narrow openings (W1). This phenomena illustrated in FIG. 6A. If the etch depth differences are small, this effect presents no problem as the thinning processes described infra can be adjusted to over-thin to compensate. Otherwise the alternative processes illustrated in FIGS. 6A and 7A-7D and described infra can be performed.

Trenches 125 and 130 extend into substrate 100 a distance D1 from top surface 105 of the substrate. Trenches 125 have a width W1 and trench 130 has a width W2. W2 is greater than W1. In one example, W1 is about 1 micron to about 3 microns. In one example, W2 is about 3 microns to about 10 microns. In one example D1 is about 50 microns to about 200 microns. In one example W1 is about 2 microns, W2 is about 5 microns and D1 is about 150 microns. Since trenches 125 and 130 may be elongated in and out of the plane of the drawings (i.e., are rectangles when viewed from above), W1 and W2 measure minimum widths of trenches 125 and 130 (i. e., the short side of the rectangle).

Figure 1C:
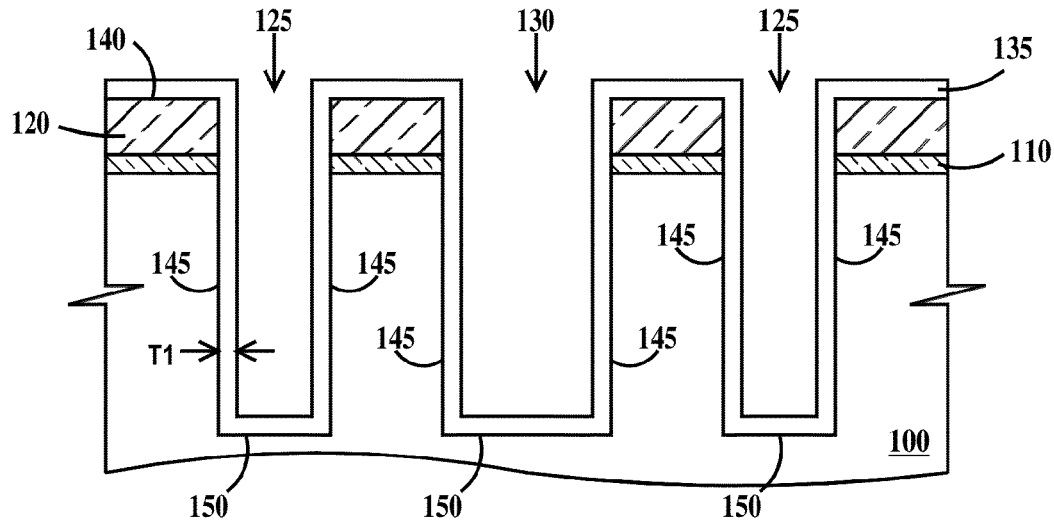

In FIG. 1C, a polysilicon layer 135 is deposited on top surfaces 140 of second dielectric layer 120, sidewalls 145 and bottoms 150 of trenches 125 and 130. In one example, polysilicon layer 135 comprises an N or a P-type doped polysilicon. In one example, polysilicon layer 135 comprises boron doped polysilicon. Polysilicon layer 135 has a thickness T1. In one example, T1 is about 0.8 microns to about 2.4 microns.

Figure 1D:
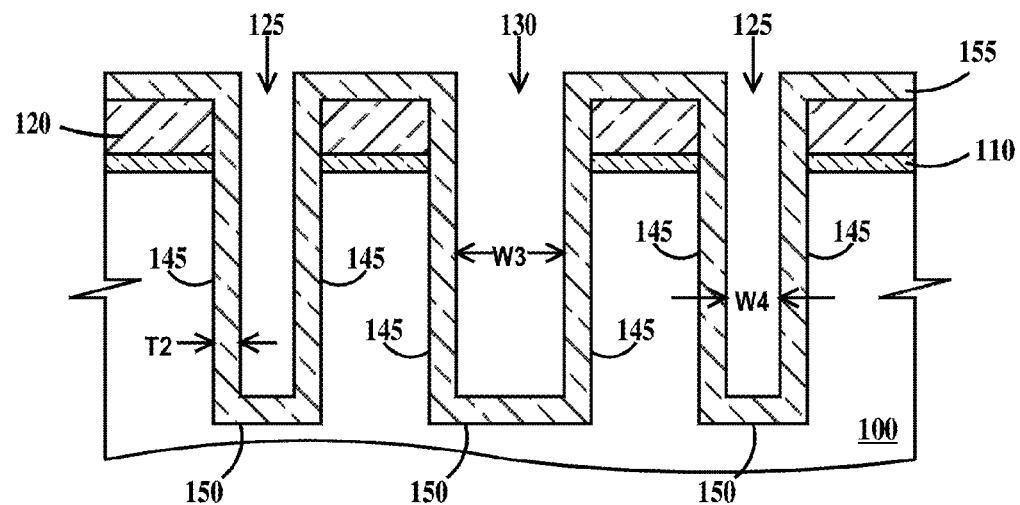

In FIG. 1D an oxidation is performed to convert polysilicon layer 135 (see FIG. 1C) to a silicon dioxide layer 155. Silicon dioxide layer 155 has a thickness T2. Silicon dioxide layer 155 does not completely fill trenches 125 and 130, because the width of trenches 125 and 130 (W1 and W2 respectively in FIG. 1B) are both less than twice the thickness T2 of silicon dioxide layer 155. In one example, the oxidation of polysilicon layer 135 (see FIG. 1C) to form silicon dioxide layer 155 is performed using a high pressure oxidation (HIPOX) process. In one example, T2 is about equal to or less than a quarter of W1. After oxidation, the distance between opposite sides of silicon dioxide layer 155 on the sidewalls of trenches 130 is W3 and the distance between opposite sides of silicon dioxide layer 155 on the sidewalls of trench 125 is W4, with W3 greater than W4.

HIPOX of boron doped polysilicon (i.e., layer 135 of FIG. 1C) is preferred because of the high oxidation rate of born doped polysilicon and the ability of HIPOX to form uniform oxide thicknesses in deep trenches.

Figure 2A:
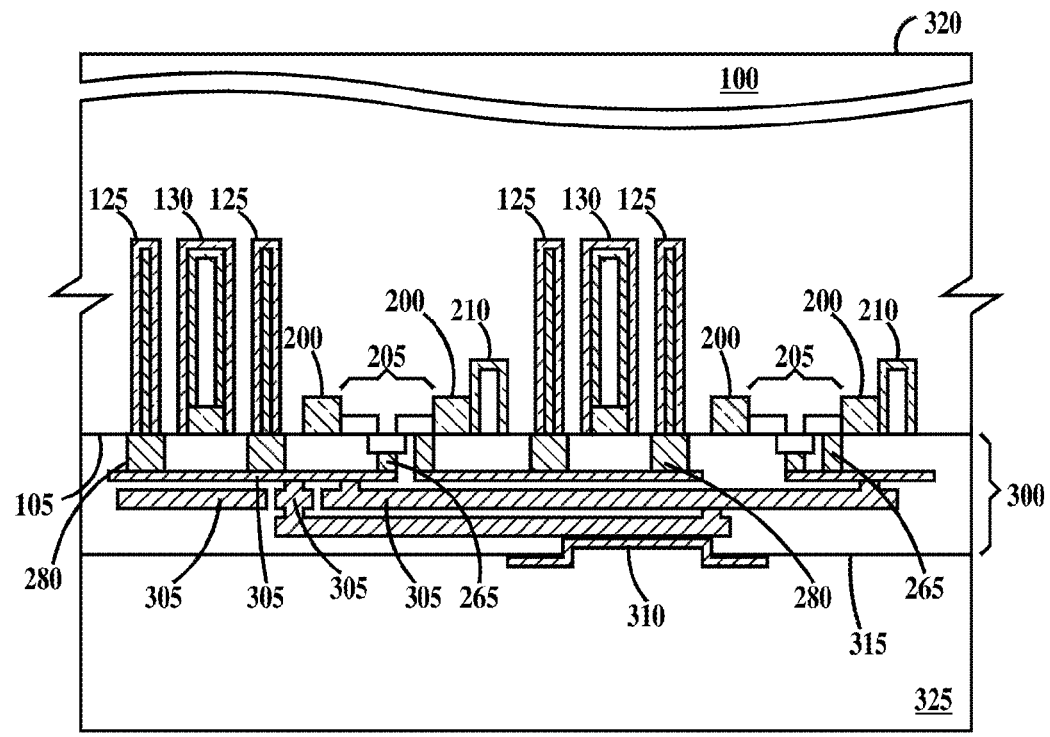
FIGS. 2A through 2J are cross-sectional drawings illustrating completion of the fabrication of the array of through wafer vias according to embodiments of the present invention and fabrication of a three-dimensional device using arrays of through wafer vias according to embodiments of the present inventions.
Figure 2B:
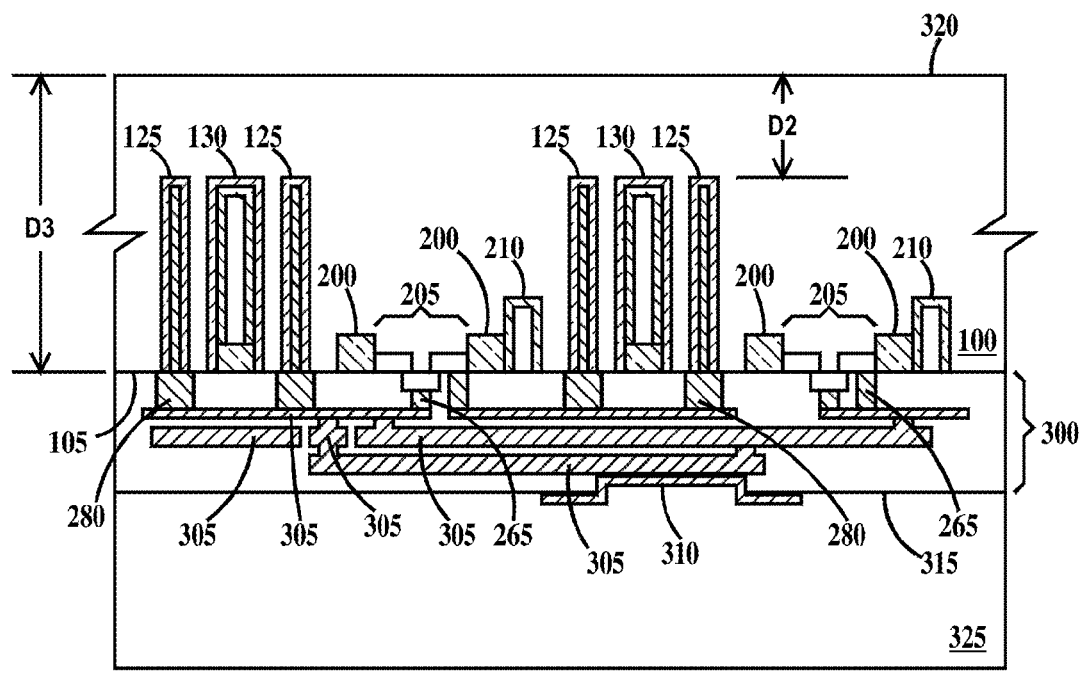

Alternatively, the structure illustrated in FIG. 1D may be formed by oxidation (e.g., in a furnace) of the sidewalls and bottoms of trenches 125 and 130 of FIG. 2B or by deposition (e.g., by chemical vapor deposition (CVD) or atomic layer deposition (ALD)) of oxide on the sidewalls and bottom of trenches 125 and 130.

Figure 1E:
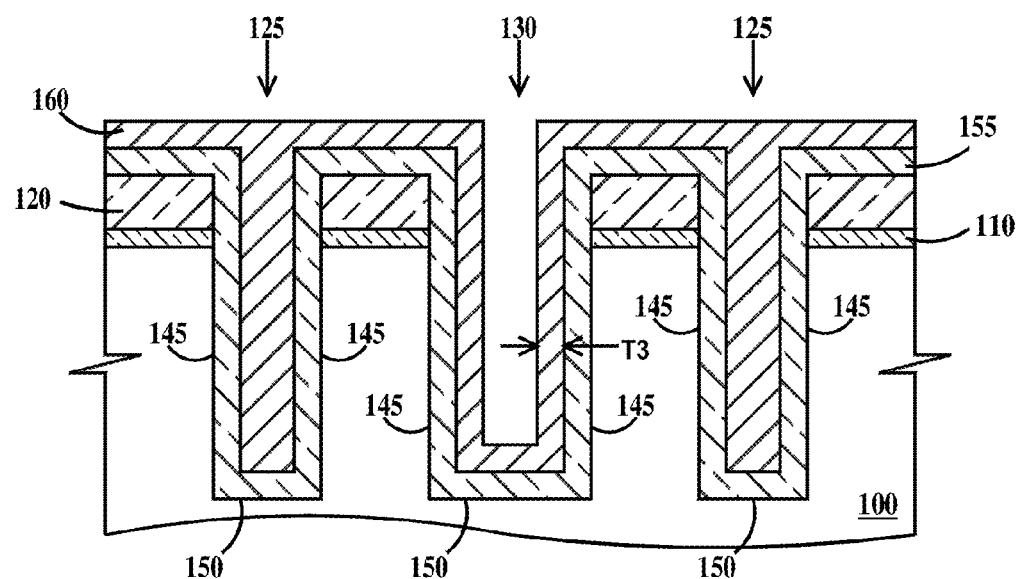

In FIG. 1E, a conformal and electrically conductive layer 160 is formed (for example, by evaporation and/or sputtering) over all exposed surfaces of silicon dioxide layer 155. Electrically conductive layer 160 completely fills trenches 125 but does not completely fill trench 130.

In one example, electrically conductive layer 160 comprises a metal. In one example, electrically conductive layer 160 comprises tungsten (W) or tungsten and titanium nitride (TiN). In one example, electrically conductive layer 160 comprises a first deposited conformal layer of titanium nitride and a second deposited layer of tungsten. In one example, electrically conductive layer 160 comprises a first deposited conformal layer of titanium nitride, a second deposited layer of conformal titanium (Ti) and a third deposited layer of tungsten. Titanium, titanium nitride and tungsten may be deposited using CVD.

In one example, electrically conductive layer 160 comprises tungsten or tungsten and tantalum nitride (TaN). In one example, electrically conductive layer 160 comprises a first deposited conformal layer of tantalum nitride and a second deposited layer of tungsten. In one example, electrically conductive layer 160 comprises a first deposited conformal layer of tantalum nitride, a second deposited layer of conformal tantalum (Ta) and a third deposited layer of tungsten. Tantalum and tantalum nitride and may be deposited using CVD.

Other metallurgical combinations that may be used for electrically conductive layer 160 include combinations of copper (Cu), ruthenium (Ru), Ta and TaN. Those combinations include the following combinations, each of which is in the order of formation: Ta/Cu, TaN/Cu, Ru/Cu, TaN/Ta/Cu/, TaN/Ru/Cu, Ta/Ru/Cu, Ru/Ta/Cu, Ru/TaN/Cu, TaN/Ta/Ru/Cu.

Electrically conductive layer 160 has a thickness T3, where T3 is equal to greater than half of W4, but less than half of W3 (see FIG. 1D).

Figure 1F:
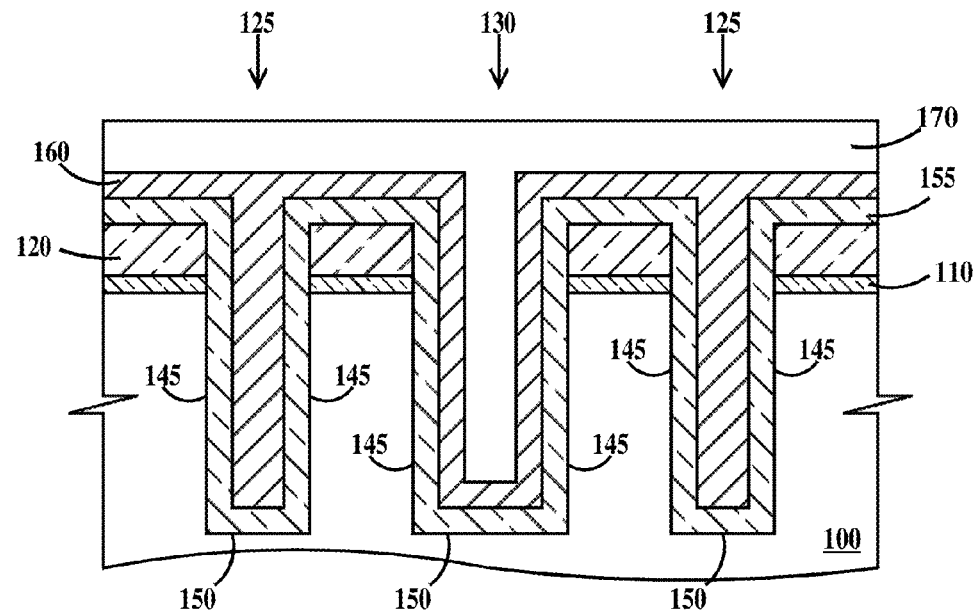
Figure 1G:
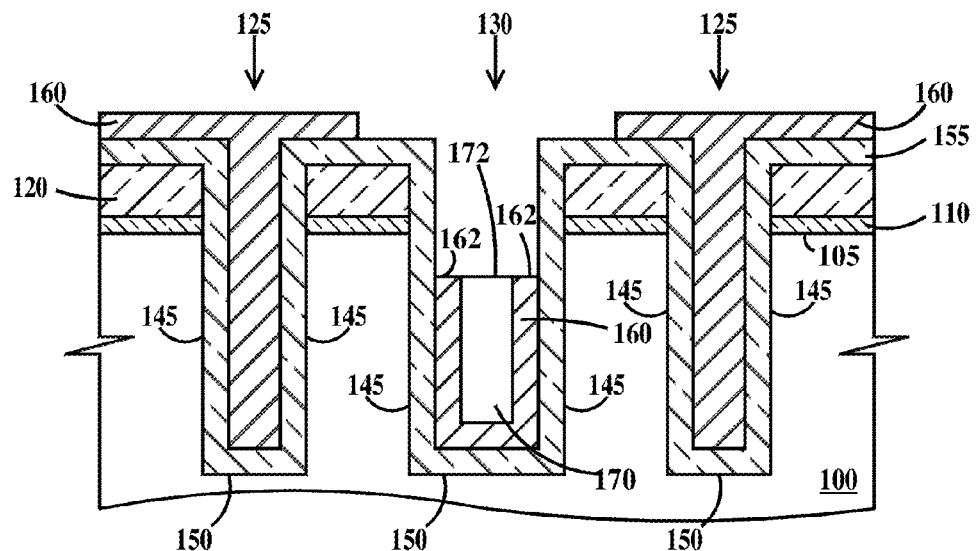

In FIG. 1F, a polysilicon layer 170 is formed all exposed surface of electrically conductive layer 160. Polysilicon layer 170 completely fills the remaining space in trench 130. In one example, polysilicon layer 170 comprises intrinsic (i.e., undoped) polysilicon.

Figure 1H:
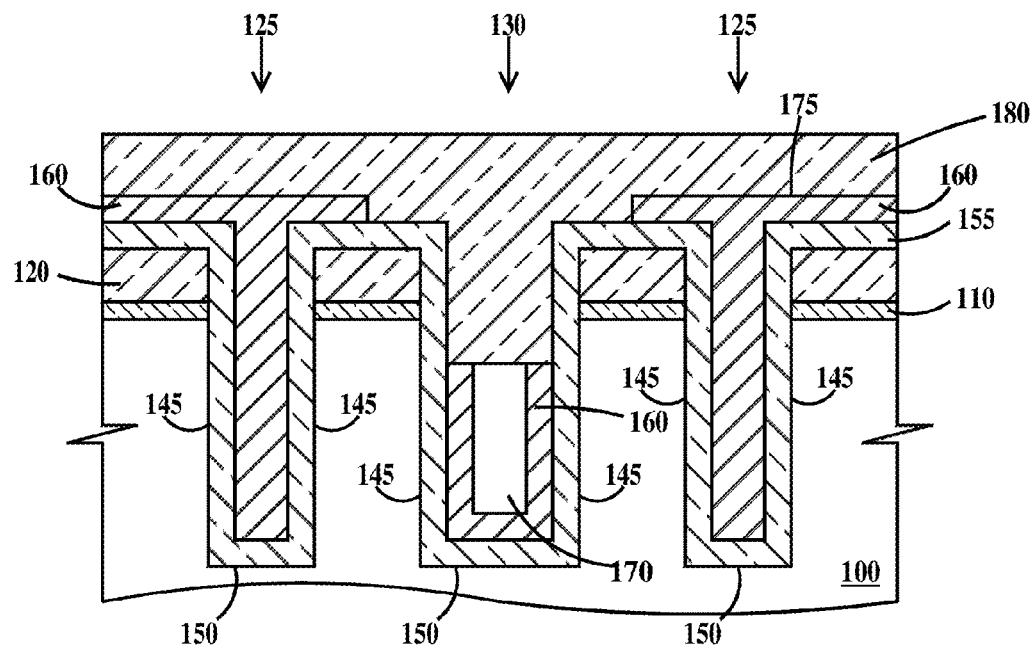
Figure 1I:
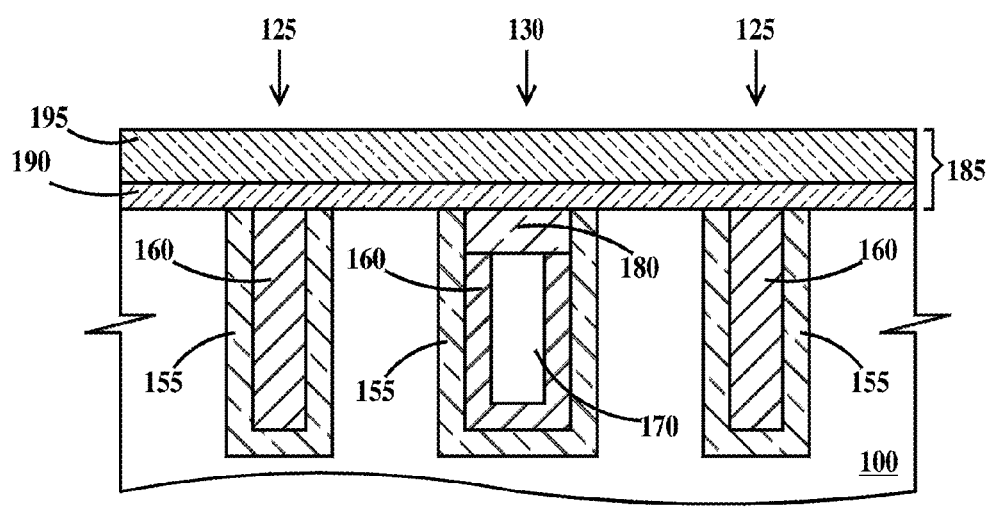
Figure 2C:
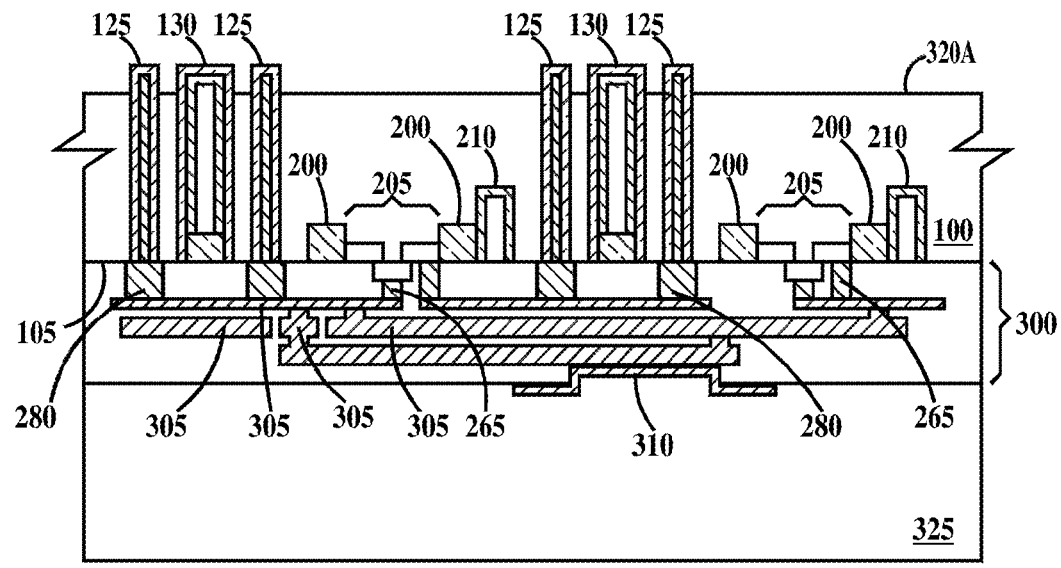
Figure 2D:
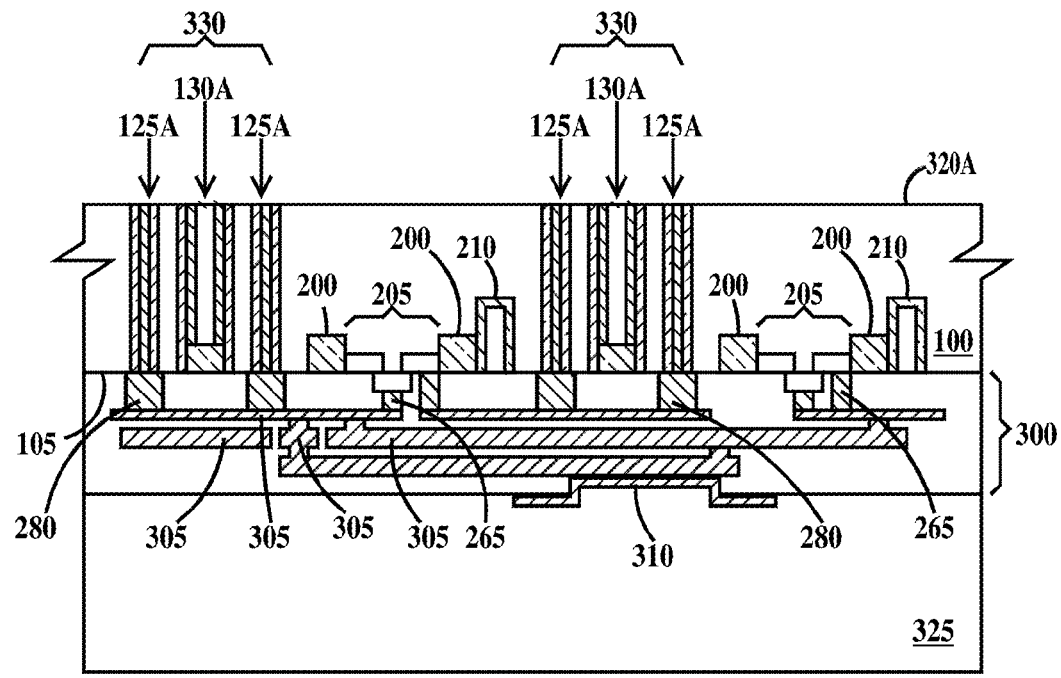
Figure 2E:
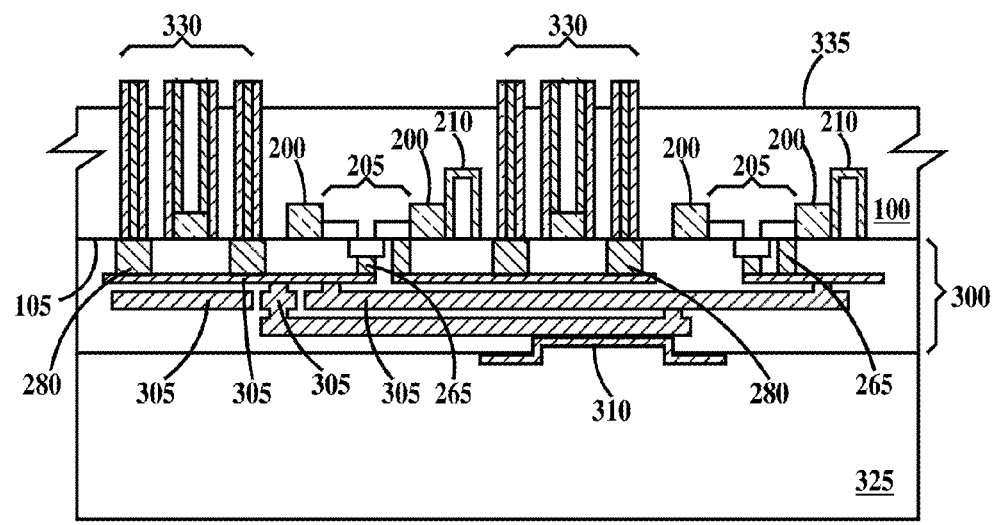
Figure 2F:
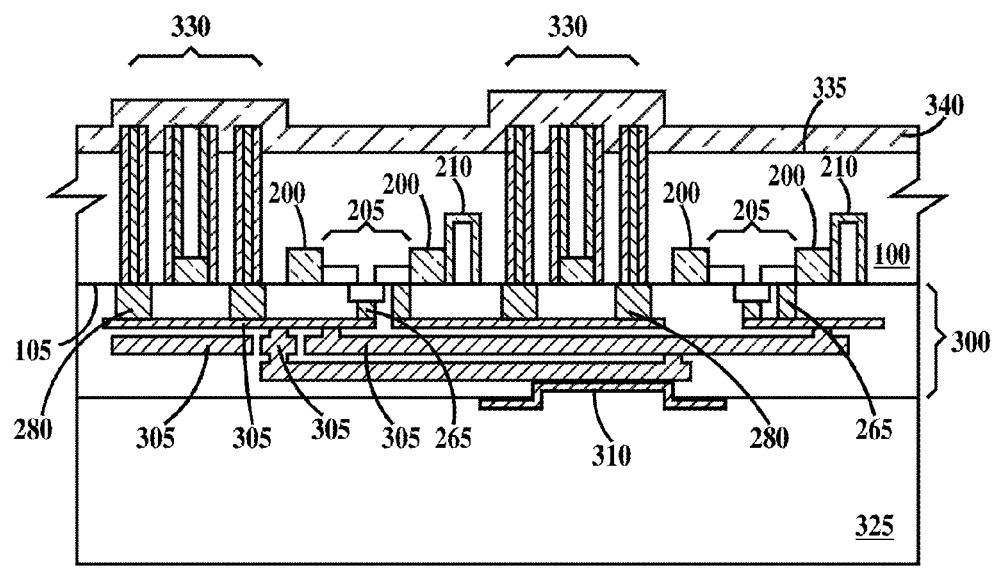
Figure 2G:
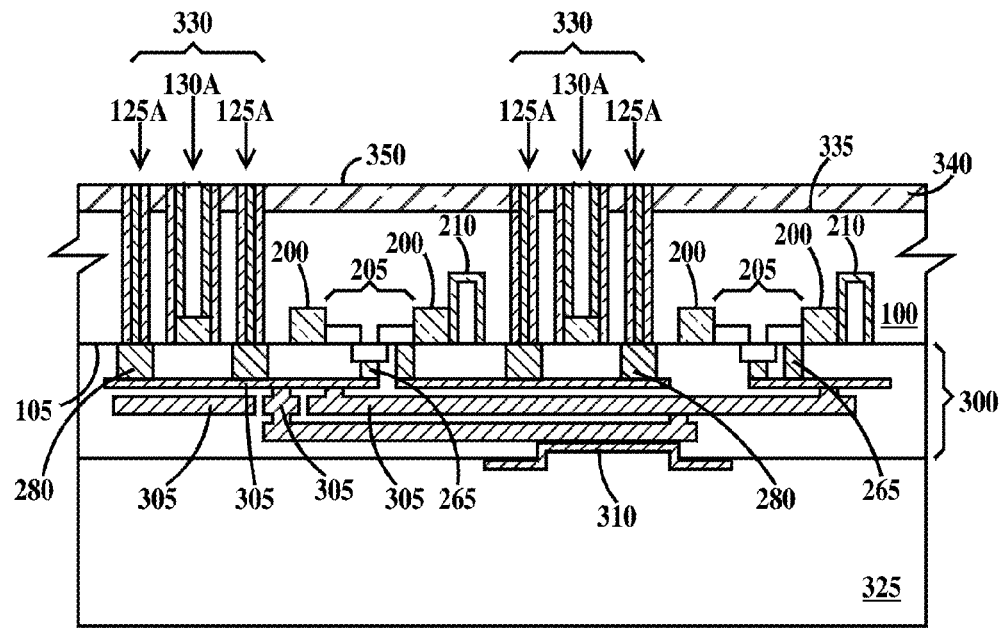

In FIG. 2G, electrically conductive layer 160 is removed from over trench 130 and recessed along with polysilicon layer 170 below top surface 105 of substrate 100. The polysilicon recess process removes all of polysilicon layer 170 not in trench 130 and from an upper region of trench 130. A surface 172 of polysilicon layer 170 remaining in trench 130 after the recess process and edges 162 of electrically conductive layer 160 are below top surface 105 of substrate 100. The layer 160 removal process and polysilicon recess process may be independently performed using RIEs, wet etches, or combinations of RIEs and wet etches. In the preferred embodiment, this recess extends below dielectric layer 110, to facilitate the capping of the trench with layer 180, as shown in FIGS. 1H and 1I.

In FIG. 1H, a dielectric layer 180 is formed on top surface 175 of electrically conductive layer 160 and completely fills the upper region of trench 130 above polysilicon layer 170. In one example dielectric layer 180 comprises TEOS oxide (oxide formed by CVD using tetraethoxysilane precursor).

In FIG. 1I, using a chemical-mechanical-polish (CMP) process, dielectric layer 180, electrically conductive layer 160, silicon dioxide layer 155, second dielectric layer 120 and first dielectric layer 110 (see FIG. 2H) are removed above top surface 105 of substrate 100 and a new first dielectric layer 190 and a new second dielectric layer 195 are formed on new top surface 105A of substrate 100. Silicon dioxide layer 155, electrically conductive layer 160 and polysilicon layer 170 remain in trench 130, electrically conductive layer 160 and polysilicon layer 170 are capped by dielectric layer 180 in trench 130. The respective fill materials in trenches 125 and 130 are protected by a protective layer comprising first and second dielectric layers 190 and 195. In one example first dielectric layer 190 is silicon dioxide and second dielectric layer 195 is silicon nitride.

Figure 1J:
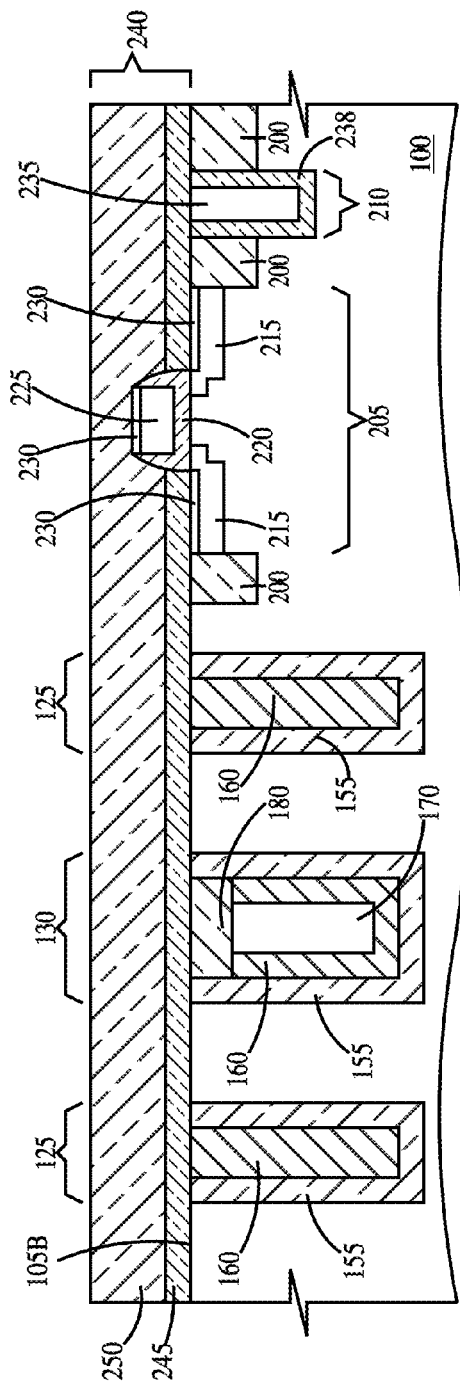

In FIG. 1J, first, STI 200 has been formed in substrate 100 by a photolithographic/etching process in combination new first and second dielectric layers 190 and 195 (see FIG. 1J) similar to that described supra followed by a TEOS CVD followed by a CMP. Second, additional photolithographic/etching process/deposition process have been performed to form a FET 205 and a trench capacitor 210. FET 205 and trench capacitor are examples of integrated circuit devices that may be formed at this point in fabrication. Other devices that may be formed at this point include bipolar transistors, BiCMOS SiGe transistors, diodes and resistors. FET 205 includes source/drains 215, a gate dielectric 220, a gate electrode 225, and silicide contacts 230. Trench capacitor 210 includes an inner plate 235 and a dielectric layer 238. Third, new first and second dielectric layers 190 and 195 are removed and a first interlevel dielectric layer 240 is formed over a new top surface 105B of substrate 100. Interlevel dielectric layer 240, by way of example, comprises a lower dielectric layer 245 and an upper dielectric layer 250. Interlevel dielectric layer 240 may be a single layer or may include more than two layers. In one example, lower dielectric layer 245 comprises silicon nitride and upper dielectric layer 250 boro-phosphosilicate glass (BPSG).

Figure 1K:
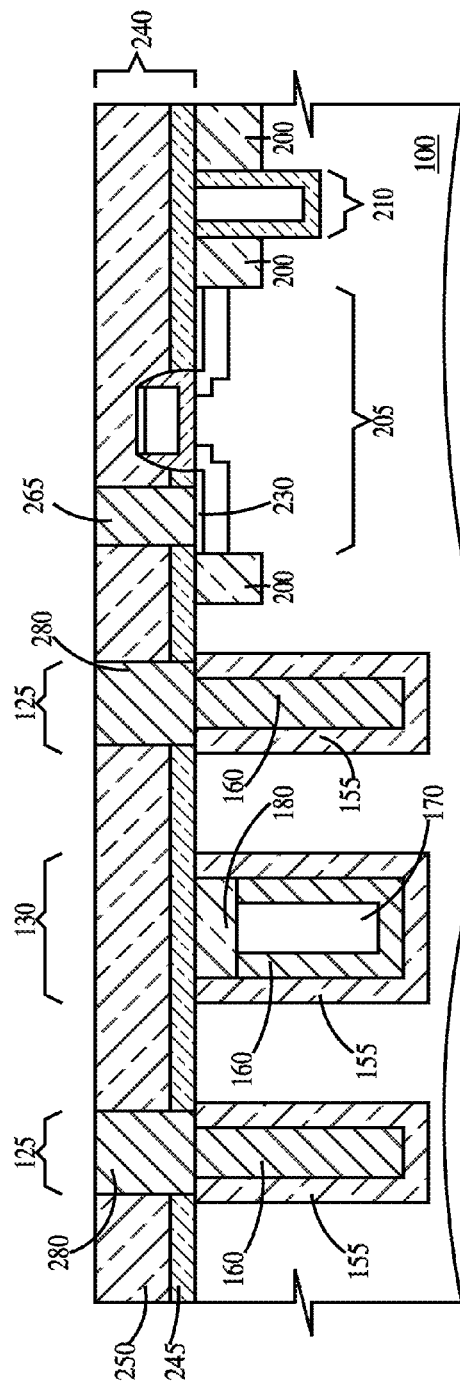

In FIG. 1J and subsequent FIG. 1K, lower dielectric layer 245 is shown as not covering gate 225 of FET 205 for clarity. In actuality, lower dielectric layer 245 may cover gate 225 of FET 205.

In FIG. 1K, a stud contact 265 to source/drain 230 of FET 205 and stud contacts 280 to electrically conductive layers 160 in trenches 125 are simultaneously formed in lower and upper dielectric layers 245 and 250. Stud contacts 265 and 280 may be formed, for example, by (1) a photolithographic/etching process as described supra to define openings in lower and upper dielectric layers 245 and 250, (2) removing the photoresist, (3) evaporating, sputtering or depositing a conductive material of sufficient thickness to fill the openings and (4) performing a CMP to remove excess conductive material and expose a top surface of upper dielectric layer 250. Top surfaces of stud contacts 265 and 280 are coplanar with a top surface of upper dielectric layer 250. In one example, stud contacts 265 and 280 comprise a metal.

In one example, stud contacts 265 and 280 comprise tungsten (W) or tungsten and titanium nitride (TiN). In one example, stud contacts 265 and 280 comprise a first deposited conformal layer of titanium nitride and a second deposited layer of tungsten. In one example, stud contacts 265 and 280 comprise a first deposited conformal layer of titanium nitride, a second deposited layer of conformal titanium (Ti) and a third deposited layer of tungsten. Titanium, titanium nitride and tungsten may be deposited using CVD.

In one example, stud contacts 265 and 280 comprise tungsten or tungsten and tantalum nitride (TaN). In one example, stud contacts 265 and 280 comprise a first deposited conformal layer of tantalum nitride and a second deposited layer of tungsten. In one example, stud contacts 265 and 280 comprise a first deposited conformal layer of tantalum nitride, a second deposited layer of conformal tantalum (Ta) and a third deposited layer of tungsten. Tantalum and tantalum nitride and may be deposited using CVD.

Other metallurgical combinations that may be used for stud contacts 265 and 280 include combinations of copper (Cu), ruthenium (Ru), Ta and TaN. Those combinations include the following combinations, each of which is in the order of formation: Ta/Cu, TaN/Cu, Ru/Cu, TaN/Ta/Cu/, TaN/Ru/Cu, Ta/Ru/Cu, Ru/Ta/Cu, Ru/TaN/Cu, TaN/Ta/Ru/Cu.

It should be understood, that many other stud contacts 265 are formed at this time to other devices in substrate 100. It should be understood, that many other stud contacts 265 are formed at this time to other devices in substrate 100. It should be also understood that by thinning substrate 100 from the bottom a through wafer via will be formed as illustrated in FIGS. 4A through 4J and described infra. Electrically conductive layers 160 in trenches 125 and 130 are electrically isolated from substrate 100 by silicon dioxide layer 155.

FIGS. 2A through 2J are cross-sectional drawings illustrating completion of the fabrication of the array of through wafer vias according to embodiments of the present invention and fabrication of a three-dimensional device using arrays of through wafer vias according to embodiments of the present inventions. In FIGS. 2A through 2J, the depth of the narrow trenches are illustrated as being the same. As mentioned supra, there are processes that may be applied if the widths if the wide and narrow trenches are such as to result in significant differences in etch depth. These alternative processes illustrated in FIGS. 6A and 7A-7D and described infra.

In FIG. 2A, (not drawn to scale) formed in a set of interlevel dielectric layers 300 are corresponding wires and vias 305. An optional terminal pad 310 is formed on a top surface 315 of the set of interlevel dielectric layers 300 and is in electrical contact with an uppermost wire 305 in an uppermost interlevel dielectric layer of the set of interlevel dielectric layers 300. Wires in a lowermost interlevel dielectric layer of the set of interlevel dielectric layers are in physical and electrical contact with stud contacts 265 and 280. Individual interlevel dielectric layers of the set of interlevel dielectric layers 300 are not illustrated in FIG. 2A. A handle substrate 325 is attached to top surface 315 of the set of interlevel dielectric layers 300. Handle wafer 325 is attached using a layer of adhesive (not shown). In one example, handle substrate 325 is a quartz wafer.

In FIG. 2B, substrate 100 is thinned from the bottom (for example, by grinding) to form a new bottom surface 320 that is a distance D2 from trenches 125 and 130. In one example, D2 is about 5 microns to about 50 microns. In one example, D2 is about 20 microns. After thinning, the thickness of substrate 100 is D3. In one example, D3 is about 50 microns to about 200 microns. In one example, D3 is about 170 microns.

In FIG. 2C, a RIE or wet etch selective to silicon is preformed to recess bottom surface 320 (see FIG. 1B) of substrate 100 so the fill material of trenches 125 and 130 protrudes above a new top surface 320A.

In FIG. 2D, a CMP is performed to remove the fill material protruding above top surface 320A (see FIG. 2C) to form through wafer via arrays 330. In the example of FIG. 2D, each through wafer via array 330 includes two conductive through wafer vias 125A and one non-conductive through via 130A. While the core formed of polysilicon layer 170 and liner formed of electrically conductive material 160 of through wafer via 130A is conductive, because of the plug formed of dielectric layer 180 (see FIG. 1I) through wafer via 130A is defined as a non-conductive through wafer via relative to conducting electricity from front surface 105 to bottom surface 335. After the CMP, the electrically conductive layer 160, polysilicon layer 160 and silicon dioxide layers 155 (see FIG. 1K) of through wafer vias 125A and 130A are exposed at bottom surface 320 of substrate 100.

In FIG. 2E, a RIE or wet etch selective to preferentially etch silicon over silicon dioxide is preformed to recess bottom surface 320A (see FIG. 2D) below the bottoms of through wafer via arrays 330 and to form a new bottom surface 335 of substrate 100.

In FIG. 2F, a dielectric layer 340 is formed over bottom surface 335 of substrate and over through wafer via arrays 330. In one example, dielectric layer 340 is a plasma enhanced chemical vapor deposition (PECVD) silicon oxide.

In FIG. 2G, a CMP is performed to remove dielectric layer 340 from over the bottom surfaces of through wafer via arrays 330. Dielectric layer 340 remains on bottom surface 335 of dielectric layer 340 and dielectric layer 340 fills any spaces between through wafer via arrays 330 between individual through wafer vias 125A and 130A of each of the through wafer via arrays. Bottom surfaces of through wafer vias 125A and 130A are coplanar with a top surface 350 of dielectric layer 340.

Alternatively, the backside grind process illustrated in FIG. 2B and described supra, can be continued until non-conductive through wafer vias 125A and conductive through wafer vias 130A of FIG. 2D are formed directly (skipping the processes of FIG. 2C) or after grinding and a "clean-up" CMP to remove any grinding damage to the through wafer vias and surface 320A (see FIG. 2D).

It should be noted that through wafer via 125A is a trench having a filling consisting only of a dielectric liner surrounding an electrically conductive core and through wafer via 130A is a trench filled only a dielectric liner surrounding an electrically conductive liner which in turn surrounds a polysilicon core with a dielectric plug between the dielectric liner and over the conductive liner and polysilicon core at one end.

Figure 2H:
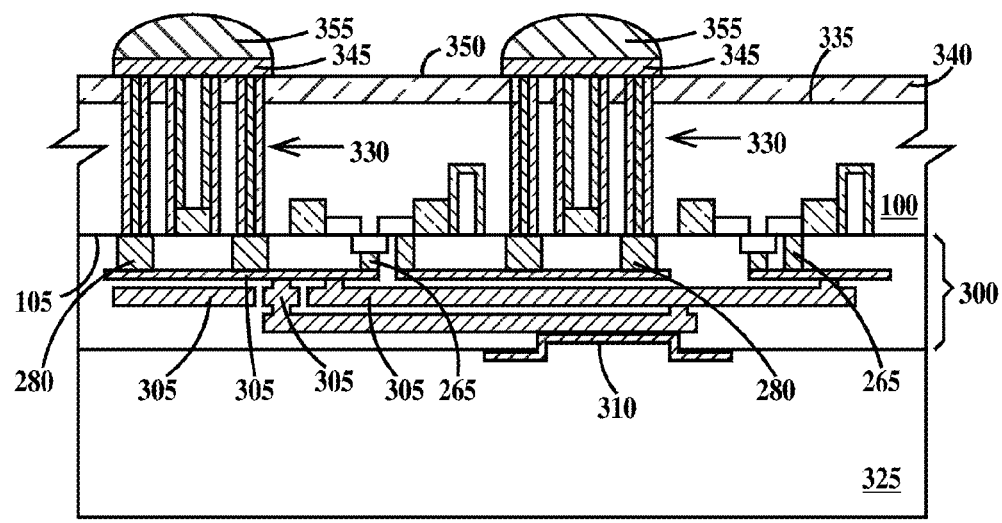

In FIG. 2H, electrically conductive pads 345 are formed on top surface 350 of dielectric layer 340 on through wafer via arrays 330 and electrically conductive solder bumps 355 are formed on pads 345. In one example, pads 345 and solder bumps 355 are formed by electroplating through a patterned photoresist layer or by evaporation through a metal mask. If pads 345 are formed by plating, a thin electrically seed layer is first deposited, which is removed after the photoresist layer is removed, by RIE or wet etching.

Figure 2I:
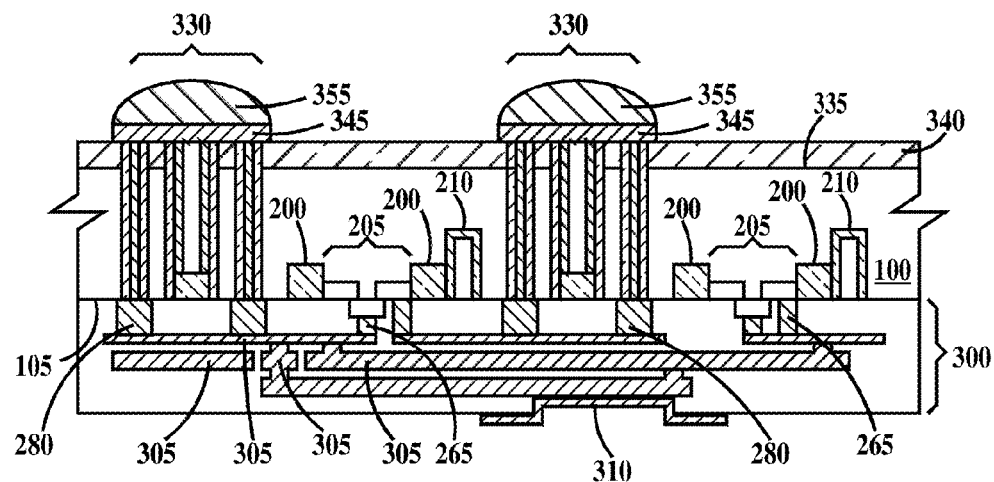

In FIG. 2I, handle wafer 325 (see FIG. 2G) is removed, either prior to or after chip dicing. An exemplary method of removing handle wafer 325 is to expose the adhesive to ultraviolet radiation as is well known in the art. In a preferred embodiment, handle wafer 325 is removed after dicing to minimize the potential for breaking the thinned wafer.

Figure 2J:
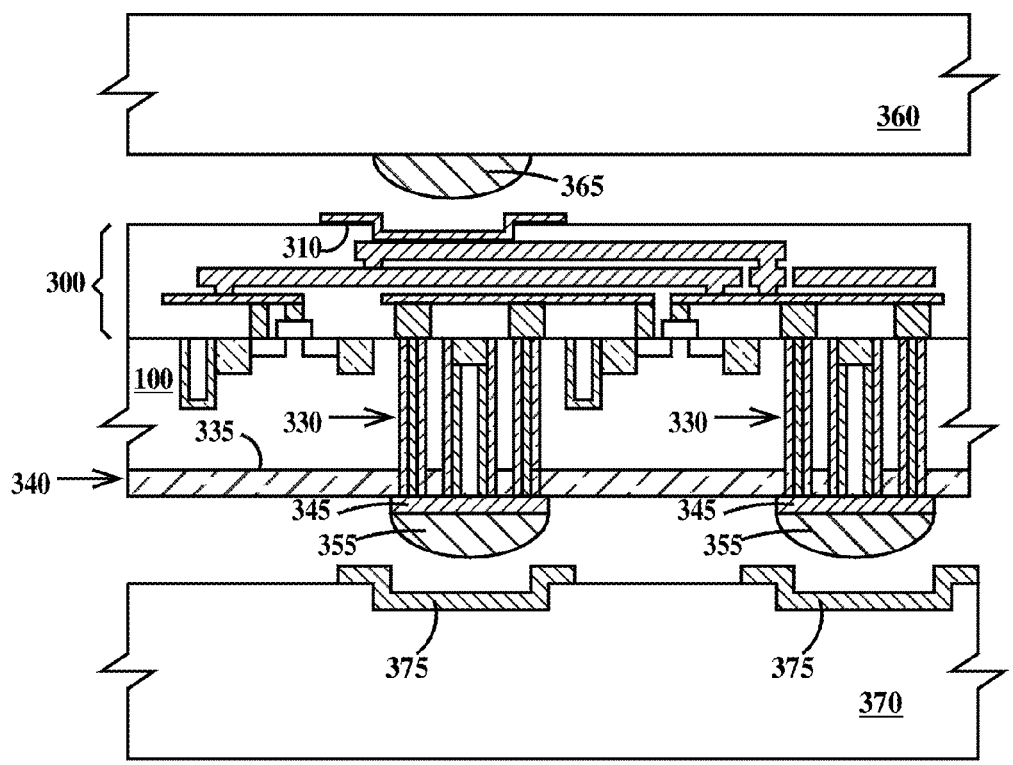

FIG. 2J is an exploded view prior to a solder reflow step. In FIG. 2J, an upper substrate 360 containing electrical components is aligned to terminal pad 310 by electrically conductive solder bumps 365, and substrate 100 is aligned to a lower substrate 370 having electrically conductive pads 375 and containing electrical components (not shown) by solder bumps 355. This arrangement allows for self alignment of the three components prior to the anneal which melts the solder bumps, electrically wires substrates 100, 360 and 370 together and completes the fabrication process. Examples of electrical components include but are not limited to, transistors, diodes, resistors, capacitors, inductors and wires.

While pad to solder bump connections are illustrated in FIG. 2J, other connection types such as pad to pad may be used (i) between substrate 360 and substrate 100, (ii) between substrate 100 and substrate 370 or (iii) between substrate 360 and substrate 100 and between substrate 100 and substrate 370 substrate. While solder bumps are shown on substrate 360 and pads on substrate 100, pads may be formed on substrate 360 and solder bumps on substrate 370. While the solder bumps are shown on substrate 100 and pads on substrate 370, pads may be formed on substrate 100 and solder bumps on substrate 370. Substrate 360 may be replaced with wire or tab bonds. If the solder bumps and pads of substrate 100 are swapped, then substrate 370 may be replaced with wire or tab bonds.

Figure 3C:
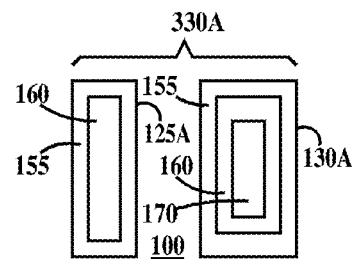
Figure 3C:
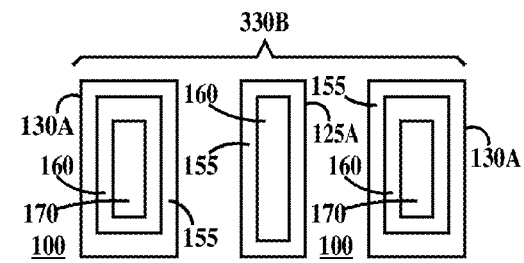
Figure 3C:
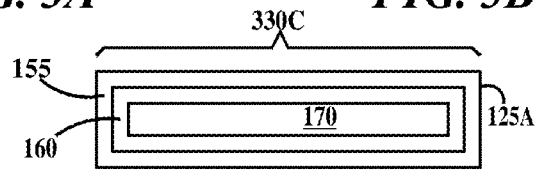
Figure 3C:
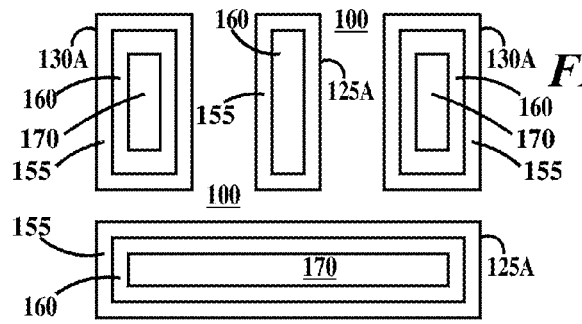

FIGS. 3A through 3D are exemplary plan views of through wafer vias according to embodiments of the present inventions. In FIG. 3A, a single through wafer via array 330A consists of an electrically conductive through wafer via 125A consisting of a electrically conductive core of electrically conductive material 160 surrounded by a liner of silicon dioxide layer 155 and a single electrically non-conductive through wafer via 130A comprising an electrically conductive liner of electrically conductive material 160 intervening between a dielectric liner of silicon dioxide layer 155 and a core of polysilicon layer 170 and a dielectric plug of dielectric layer 180 (not illustrated in FIG. 3A (or FIGS. 3B, 3C and 3D, see FIG. 1K)).

In FIG. 3B, a through wafer via array 330B consists of two electrically non-conductive through wafer vias 130A on opposite sides of electrically non-conductive through wafer via 125A.

In FIG. 3C, a through wafer via 330C consists of four electrically non-conductive through wafer vias 130A on opposite each of the four sides of electrically conductive through wafer via 125A.

Figure 3D:
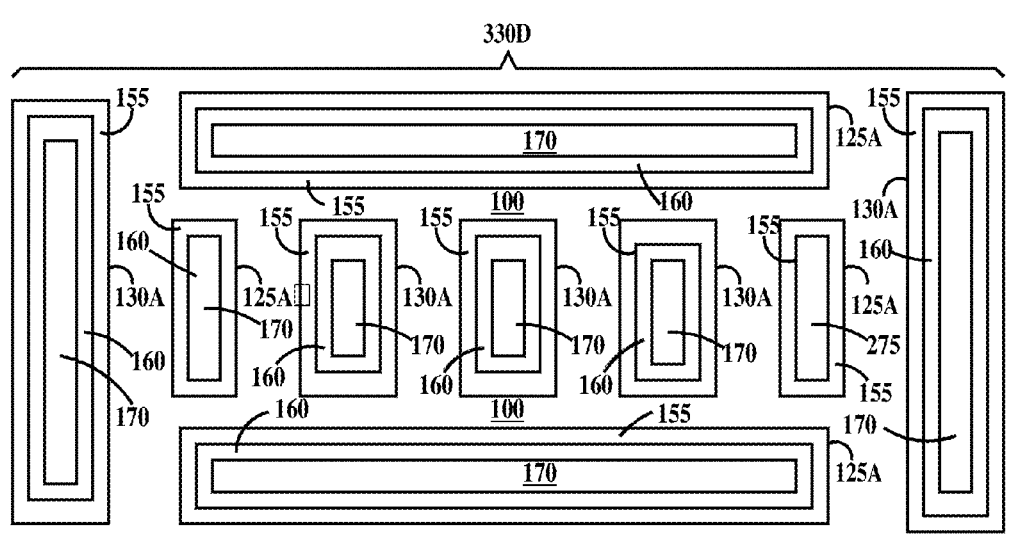

In FIG. 3D, through wafer via 330D consists of seven electrically non-conductive through wafer vias 130A and two electrically conductive through wafer vias 125. Three of the electrically non-conductive through wafer vias 130A are positioned between the two electrically conductive through wafer vias 125A. Four of the electrically non-conductive through wafer vias 125A are positioned opposite each of the four sides formed by the combination the first three non-electrically conductive through wafer vias 130A and the two through electrically conductive through wafer vias 125A. Through wafer vias 330B, 330C and 330D function as coplanar waveguides.

In each of FIGS. 3A, 3B, 3C and 3D every through wafer via 125A and 130A is surrounded by a region of substrate 100. Through wafer vias 330B, 330C and 330D function as coplanar waveguides.

Through wafers vias of the present embodiment of the present invention includes at least one electrically conductive element extending from the top surface of the substrate, through the substrate, to the bottom surface of the substrate and at least one non-electrically conductive (i.e., dielectric or insulator) element also extending from the top surface of the substrate, through the substrate, to the bottom surface of the substrate.

It should be understood that very many other through wafer via arrays having different numbers and configurations of through wafers vias 125A and 130A are possible and are not limited to those illustrated in FIGS. 3A, 3B, 3C and 3D.

FIGS. 4A through 4D are schematic plan views of waveguide models using through wafer vias according to embodiments of the present invention. In FIGS. 4A, 4B, 4C and 4D, G indicates an electrical conductor filled trench that is not insulated from the substrate and that is connected to ground, S indicates an electrical conductor filled trench that is not insulated from the substrate and is connected to a signal source, I indicates an electrical insulator filled trench, IG indicates an electrical conductor filled trench connected to ground and that is insulated from the substrate and IS indicates an electrical conductor filled trench connected to a signal source and that is insulated from the substrate. The space between the G, S, I, IG and IS structures is substrate.

The structures of FIGS. 4A, 4B, 4C and 4D were modeled as signal waveguides for characteristic impedance, propagation loss and effective dielectric constant (Er). Low propagation loss and small effective dielectric constant are preferred. The model was based on a silicon substrate with a relative dielectric constant of 11.9 and a conductivity of 7.41 Siemens/meter; tungsten with a conductivity of 1.82E7 Siemens/meter for the electrical conductor for the G, IG, S and IS structures; and silicon dioxide with a relative dielectric constant of 4.1 for the insulator of the I, IG and IS structures.

The dimensions of the G and S structures in top view was 50 by 3 microns. The dimensions of the IG and IS structures in top view was 52 by 5 microns (the G and S structures with a surrounding insulator 1 micron thick). The dimensions of the I structures in top view was 52 by 5 microns. Simulation was performed on an Ansoft HFSS-3D full wave EM simulator. Table I gives the result of the simulation for each of the structures of FIGS. 4A, 4B 4C and 4D.

TABLE I

Figure 4A:
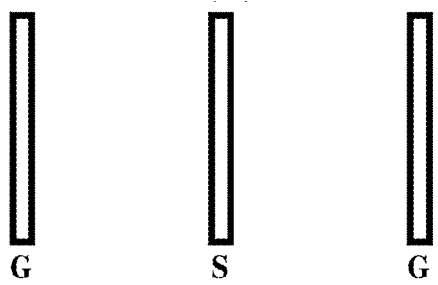
FIGS. 4A through 4D are schematic plan views of waveguide models using through wafer vias according to embodiments of the present invention.
Figure 4B:
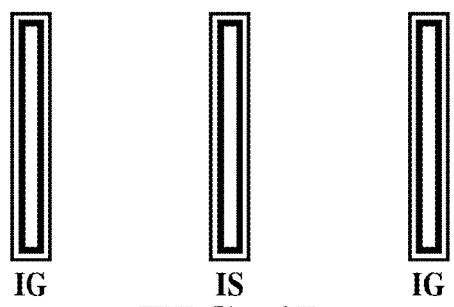
Figure 4C:
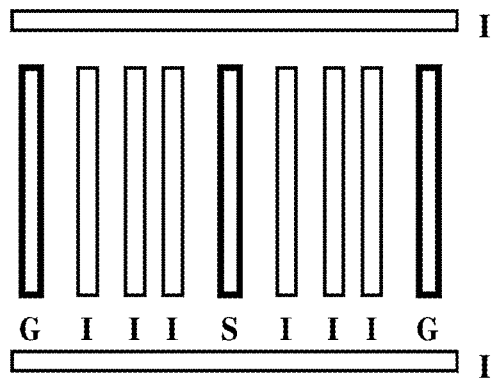
Figure 4D:
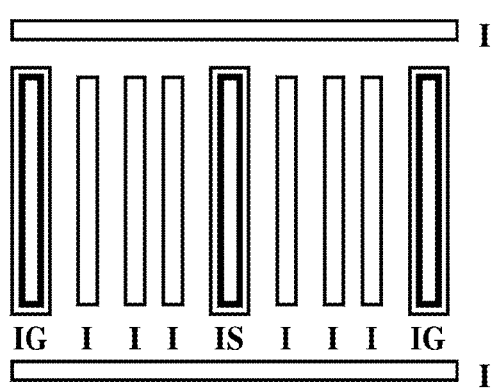

| CASE | Characteristic Impedance | Propagation Loss (dB/mm) | Propagation Loss % of Case 1 | Effective Er |
|---|---|---|---|---|
| FIG. 4A | 22.61 + j0.96 | 1.329 | 100 | 12.136 |
| FIG. 4B | 24.08 + j071 | 1.062 | 79.9 | 10.722 |
| FIG. 4C | 27.07 + j0.37 | 0.777 | 58.5 | 8.4657 |
| FIG. 4D | 28.42 + j0.23 | 0.635 | 47.8 | 7.7056 |

The following conclusions can be reached as a result of the simulation. For coplanar waveguides, insulated through wafer vias have a higher characteristic impedance, less propagation loss, lower effective dielectric constant and is better for signal propagation with less potential un-wanted coupling. The reasons are, silicon is lossy, but silicon dioxide is not. The higher dielectric constant of silicon causes higher parasitic capacitance relative to parasitic capacitance of the lower dielectric constant silicon dioxide.

Thus, a through wafer via that contacts the substrate directly (G structure) as in the embodiments of the present invention, may be used for the ground structure as long as the voltage across the through wafer via is low enough for little or no current is conducted through the substrate. For the signal structure, an insulated conductor (IS structure) such as in the second and third embodiments of the present invention is preferred to reduce signal conduction through the substrate.

Figure 5:
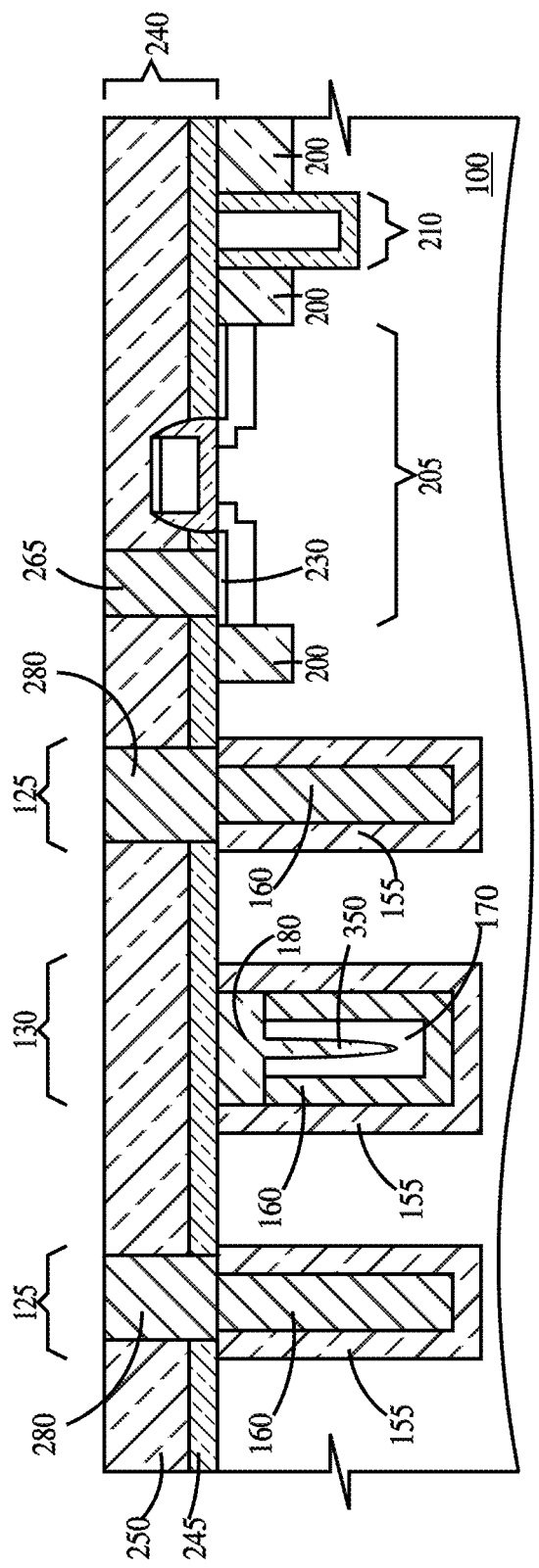
FIG. 5 is cross-sectional drawing illustrating an alternative through wafer via structure according to embodiments of the present invention.

FIG. 5 is cross-sectional drawing illustrating an alternative through wafer via structure according to the embodiments of the present invention. When polysilicon is deposited into a deep trench, there is a tendency for a void to be formed where the polysilicon deposited on opposite sidewalls meet in what is called the seam. The void forms because of pinch-off at the top of the trench. This can result in a slightly different structure than that shown in FIG. 1K. FIG. 5 is similar to FIG. 1K except dielectric layer 180 extends into a void 350 in polysilicon layer 170.

Figure 6A:
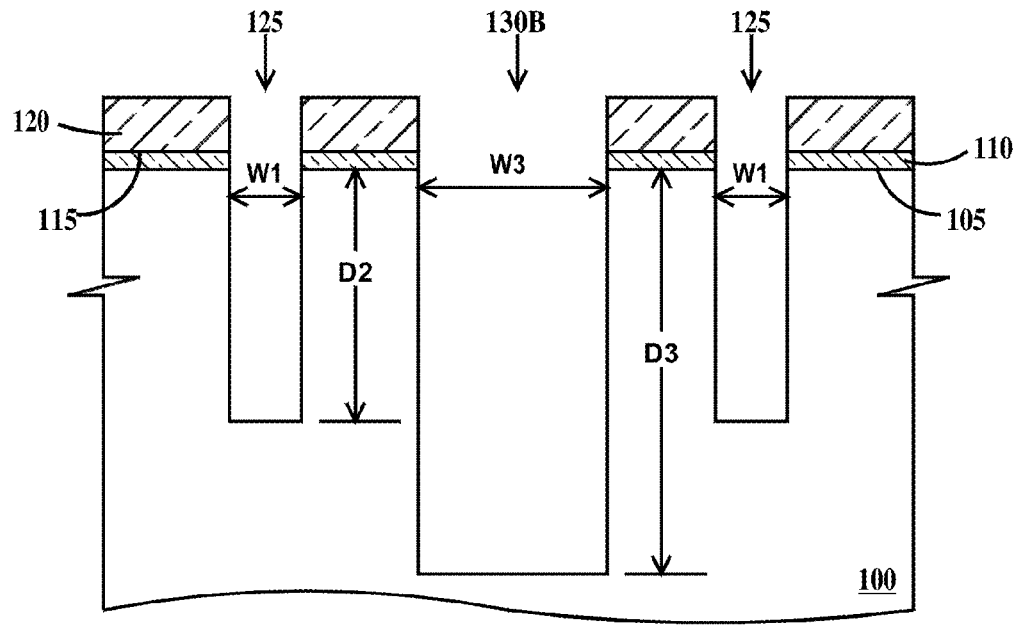
FIG. 6A illustrates the phenomena of wide trenches etching deeper than narrow trenches and FIG. 6B

FIG. 6A illustrates the phenomena of wide trenches (130B) etching deeper than narrow trenches (125). FIG. 6A is a cross-sectional drawing illustrating an alternative structure to that illustrated in FIG. 1B. In FIG. 5, trench 130B extend a distance D3 into substrate 100 from top surface 105, while trenches 125 extend into substrate 100 from top surface 105 the distance D2 as described supra with respect to FIG. 1B. D3 is greater than D2, while D2 is equal to D1 (see FIG. 1B).

Figure 6B:
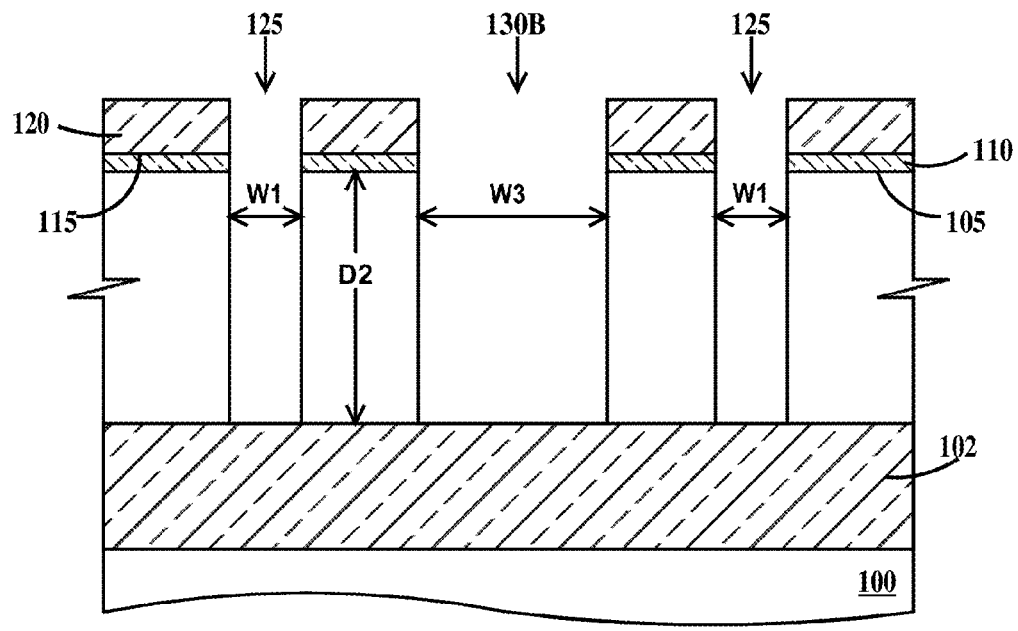
FIG. 6B illustrates a method of mitigating the effect of wide trenches etching deeper than narrow trenches.

FIG. 6B illustrates a method of mitigating the effect of wide trenches etching deeper than narrow trenches. In FIG. 6B, a buried oxide layer 102 has been formed a distance D2 into substrate 100. Trenches 125 and 130B will stop etching vertically when buried oxide layer 102 is reached. In one example substrate 100 is a silicon-on-insulator substrate and buried oxide layer 102 is silicon oxide.

Figure 7A:
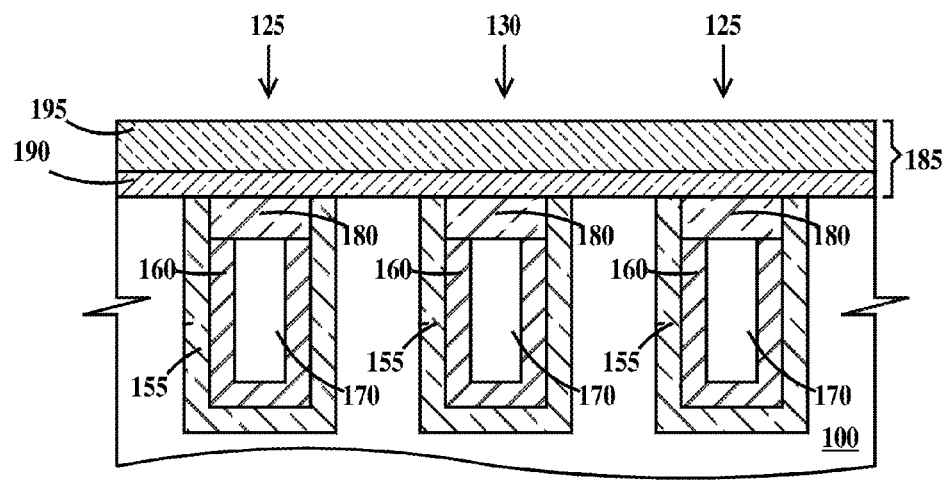
FIGS. 7A through 7D illustrate an alternative method of fabricating through vias according to embodiments of the present invention.
Figure 7B:
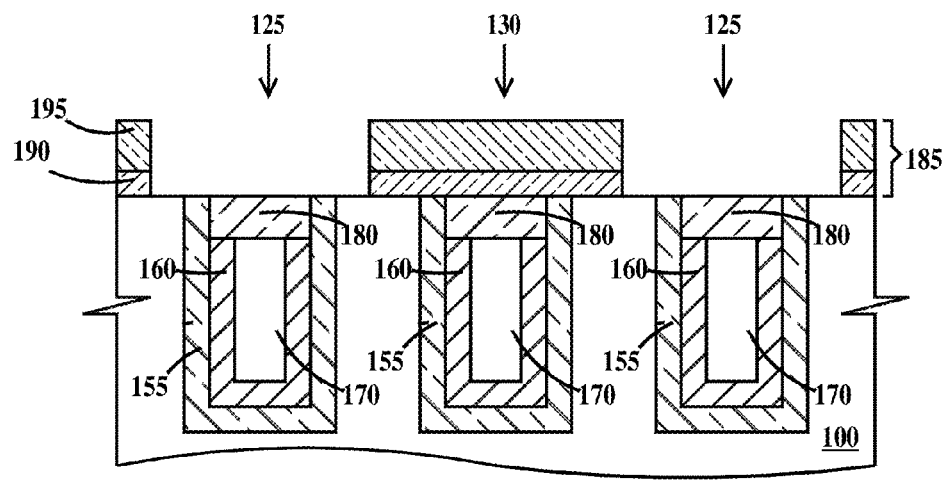
Figure 7C:
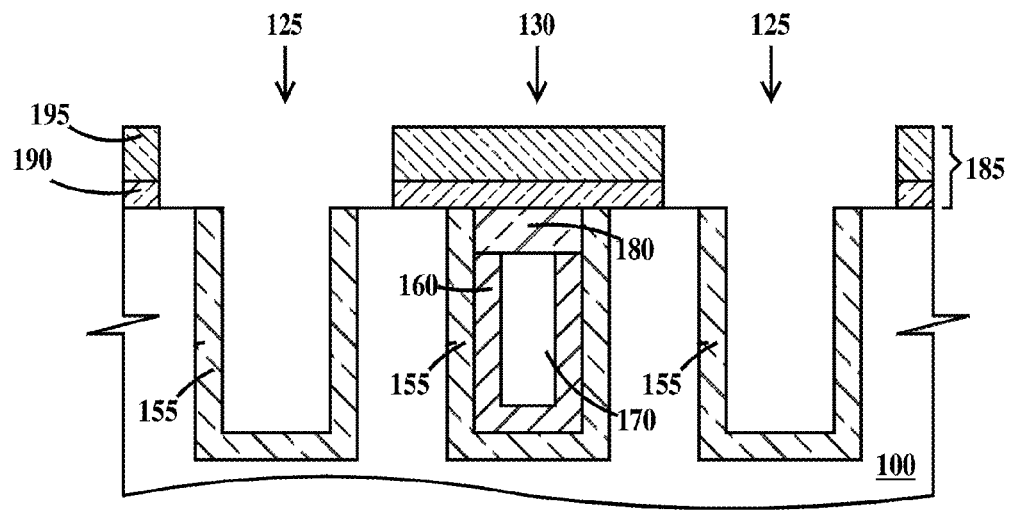
Figure 7D:
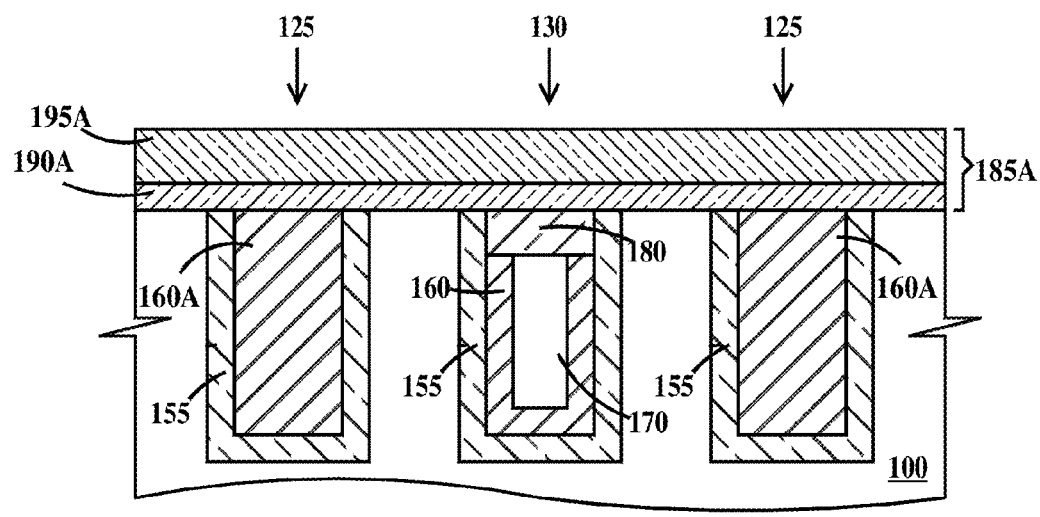

FIGS. 7A through 7D illustrate an alternative method of fabricating through vias according to embodiments of the present invention. FIG. 7A is similar to 1H except trenches 125 and 130 were the same width so after the processing described supra with respect to FIGS. 1A through 1G are preformed, the fill of trenches 125 is the same as for trench 130. In FIG. 7B openings over trenches 125 are made in layer 185. In FIG. 7B plug 185, polysilicon are removed in trenches 125. FIG. 7D is similar to FIG. 1M after the steps described in reference to FIGS. 1L and 1M have been performed.

Thus, the embodiments of the present invention provide a structure and method to integrate through wafer vias into existing integrated circuit fabrication processes having in good propagation of signals from/to the front surface of the integrated circuit chip to/from the bottom surface of the integrated circuit chip.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method, comprising:
(a) forming a first trench and a second trench in a semiconductor substrate, said first and second trenches extending in a first direction from a top surface of said substrate toward an opposite bottom surface of said substrate a distance less than a thickness of said substrate in said first direction;
after (a), (b) simultaneously forming a first liner of a dielectric material on sidewalls of said first trench and a second liner of said dielectric material on sidewalls of said second trench;
after (b), (c) filling remaining space in said first trench with an electrically conductive material and forming a third liner of said electrically conductive material on said second liner, said third liner not completely filling said second trench;
after (c), (d), filling remaining space in said second trench with a polysilicon core, recessing said polysilicon core and said third liner below said top surface of said substrate, and forming, in said second trench, a dielectric plug on said polysilicon core and said third liner; and
after (d), (e) thinning said substrate from said bottom surface of said substrate to form a new bottom surface of said substrate, said electrically conductive material of said first trench and said liner and polysilicon core of said second trench exposed in said new bottom surface of substrate.

2. The method of claim 1, wherein (b) includes:
forming a polysilicon layer on sidewalls of said first trench and on said sidewalls of said second trench; and
oxidizing said polysilicon layer to form said first liner on sidewalls of said first trench and said second liner on sidewalls of said second trench.

3. The method of claim 2, wherein said polysilicon is doped with boron.

4. The method of claim 1, wherein (e) includes:
grinding said bottom surface of said substrate to form a ground surface of said substrate;
chemically etching said ground surface of said substrate to expose said electrically conductive material of said first trench and said liner of said second trench; and
chemical-mechanical-polishing said conductive material of said first trench and said liner and polysilicon core of said second trench.

5. The method of claim 1, further including:
forming an electrically conductive backside pad in physical and electrical contact with said electrically conductive material of said first trench, said dielectric liner of said second trench and said polysilicon core of said second trench.

6. The method of claim 5, further including:
(f) forming an insulating layer on said new bottom surface of said substrate, said electrically conductive material of said first trench extending through said insulating layer and said dielectric liner and polysilicon core of said second trench extending through said insulating layer, said backside pad formed on said insulating layer.

7. The method of claim 1, wherein said electrically conductive material comprises (i) tungsten, (ii) copper, (iii) tungsten in combination with titanium, titanium nitride or titanium and titanium nitride, (iv) tungsten in combination with tantalum and tantalum nitride, (v) copper in combination with one or more of titanium, titanium nitride and ruthenium, or (vi) copper in combination with one or more of tantalum, tantalum nitride and ruthenium.

8. A method of forming signal transmission line through a semiconductor substrate, said substrate having a top surface and an opposite bottom surface, comprising:
forming a conductive through via extending from said top surface of said substrate to said bottom surface of said substrate, sidewalls of said conductive through via in physical and electrical contact with said substrate, sidewalls of said conductive through via electrically insulated from said substrate; and
forming a non-conductive through via extending from said top surface of said substrate to said bottom surface of said substrate, said nonconductive through via proximate to and separated from said conductive through wafer via by a region of said substrate, said non-conductive through via comprising a conductive core electrically insulated from said substrate by a dielectric liner and having a dielectric plug recessed between said liner in an end proximate to said top surface of said substrate.

9. The method of claim 8, further including;
forming an additional non-conductive through via extending from said top surface of said substrate to said bottom surface of said substrate, said additional non-conductive through via disposed on an opposite side of said conductive through via from said non-conductive through via, said additional nonconductive through via proximate to and separated from said conductive through via by an additional region of said substrate, said additional non-conductive through via comprising a conductive core electrically insulated from said substrate by a dielectric liner and having a dielectric plug recessed between said liner in an end proximate to said top surface of said substrate.

10. The method of claim 8, further including:
forming first, second and third additional non-conductive through vias extending from said top surface of said substrate to said bottom surface of said substrate, said non-conductive through via and said first, second and third additional non-conductive through vias disposed on respective first, second, third and fourth sides of said conductive through via, said first side opposite said second side, said third side opposite said fourth side; said first, second and third additional non-conductive through vias separated from said conductive through region by respective first, second and third additional regions of said substrate, said first, second and third additional non-conductive through vias each comprising a conductive core electrically insulated from said substrate by a dielectric liner and having a dielectric plug recessed between said liner in an end proximate to said top surface of said substrate.

11. The method of claim 8, further including:
forming an additional conductive through via extending from said top surface of said substrate to said bottom surface of said substrate, sidewalls of said additional conductive through via in physical and electrical contact with said substrate, sidewalls of said additional conductive through via electrically insulated from said substrate.

12. The method of claim 11, further including:
forming one or more interior non-conductive through vias extending from said top surface to said bottom surface of said substrate, said one or more interior non-conductive through vias intervening between said conductive through via and said additional conductive through via, said one or more interior non-conductive through vias on an opposite side of said conductive through via from said non-conductive through via, said one or more interior non-conductive through vias each comprising a conductive core electrically insulated from said substrate by a dielectric liner and having a dielectric plug recessed between said liner in an end proximate to said top surface of said substrate.

13. The method of claim 12, further including:
an additional non-conductive through via extending from said top surface of said substrate to said bottom surface of said substrate, said additional non-conductive through via disposed on an opposite side of said additional conductive through via from said one or more interior non-conductive through vias, said additional non-conductive through via comprising a conductive core electrically insulated from said substrate by a dielectric liner and having a dielectric plug recessed between said liner in an end proximate to said top surface of said substrate.

14. The method of claim 13, further including:
forming first and second exterior non-conductive through vias extending from said top surface of said substrate to said bottom surface of said substrate, said first and second exterior non-conductive through vias disposed different sides of a core group consisting of said conductive through via, said one or more interior non-conductive through vias and said additional conductive through via, said first and second interior non-conductive through vias each comprising a conductive core electrically insulated from said substrate by a dielectric liner and having a dielectric plug recessed between said liner in an end proximate to said top surface of said substrate.

15. The signal transmission line of claim 8, further including:
forming first and second additional conductive through wafer via extending from said top surface of said substrate to said bottom surface of said substrate, sidewalls of said additional conductive through via in physical and electrical contact with said substrate, sidewalls of said first and second additional conductive through vias electrically insulated from said substrate.

16. The signal transmission line of claim 15, further including:
forming first one or more interior non-conductive through vias extending from said top surface of said substrate to said bottom surface of said substrate, said first one or more non-conductive through vias intervening between said conductive through via and said first additional conductive through via, said first one or more interior non-conductive through vias on an opposite side of said conductive through via from said additional non-conductive through via, said first one or more non-conductive through via each comprising a conductive core electrically insulated from said substrate by a dielectric liner and having a dielectric plug recessed between said liner in an end proximate to said top surface of said substrate.

17. The signal transmission line of claim 16, further including:
forming second one or more interior non-conductive through vias extending from said top surface of said substrate to said bottom surface of said substrate, said second one or more non-conductive through vias intervening between said first additional conductive through via and said second additional conductive through via, said second one or more interior non-conductive through vias on an opposite side of said conductive through via from said non-conductive through via, said second one ore more non-conductive through vias each comprising a conductive core electrically insulated from said substrate by a dielectric liner and having a dielectric plug recessed between said liner in an end proximate to said top surface of said substrate.

18. The signal transmission line of claim 17, further including:
forming an additional non-conductive through via extending from said top surface of said substrate to said bottom surface of said substrate, said additional non-conductive through via disposed on an opposite side of said second additional conductive through via from said second one or more interior non-conductive through vias said additional non-conductive through via comprising a conductive core electrically insulated from said substrate by a dielectric liner and having a dielectric plug recessed between said liner in an end proximate to said top surface of said substrate.

19. The signal transmission line of claim 18, further including:
forming first and second exterior non-conductive through vias extending from said top surface of said substrate to said bottom surface of said substrate, said first and second exterior non-conductive through vias disposed different sides of a core group consisting of said conductive through via, said first one or more interior non-conductive through vias, said first additional conductive via, said first one or more interior non-conductive through vias, and said additional conductive through via, said first and second exterior non-conductive through vias each comprising a conductive core electrically insulated from said substrate by a dielectric liner and having a dielectric plug recessed between said liner in an end proximate to said top surface of said substrate.

* * * * *